United States Patent
Xia et al.

(10) Patent No.: US 12,003,222 B2
(45) Date of Patent: Jun. 4, 2024

(54) METHODS AND APPARATUS TO GENERATE A MODULATION PROTOCOL TO OUTPUT AUDIO

(71) Applicant: Texas Instruments Incorporated, Dallas, TX (US)

(72) Inventors: Yinglai Xia, Plano, TX (US); Yogesh Ramadass, San Jose, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/402,264

(22) Filed: Aug. 13, 2021

(65) Prior Publication Data

US 2023/0049670 A1 Feb. 16, 2023

(51) Int. Cl.
*H03F 3/217* (2006.01)
*H03F 3/387* (2006.01)
*H03F 3/72* (2006.01)

(52) U.S. Cl.
CPC .......... *H03F 3/2178* (2013.01); *H03F 3/387* (2013.01); *H03F 3/72* (2013.01); *H03F 2200/03* (2013.01); *H03F 2203/7206* (2013.01)

(58) Field of Classification Search
CPC .......... H03F 3/2178; H03F 3/387; H03F 3/72; H03F 2200/03; H03F 2203/7206; H03F 3/217; H03F 3/2173; H03F 3/2171; H03F 2200/351
USPC ............................................. 330/251, 207 A
See application file for complete search history.

(56) References Cited

U.S. PATENT DOCUMENTS

| | | | | |
|---|---|---|---|---|
| 5,898,340 A | * | 4/1999 | Chatterjee | H03G 3/001 330/285 |
| 6,078,214 A | * | 6/2000 | Zhang | H03F 3/38 330/10 |
| 6,249,182 B1 | * | 6/2001 | Pullen | H03F 3/2171 330/10 |
| 6,788,137 B2 | * | 9/2004 | Morita | H03F 3/2171 330/10 |
| 7,656,202 B2 | * | 2/2010 | Kaiho | H03K 17/6872 327/108 |
| 7,816,981 B2 | * | 10/2010 | Morishima | H03F 3/217 330/10 |

(Continued)

OTHER PUBLICATIONS

International Search Report for PCT/US2022/044204 dated Jan. 6, 2023; 3 pages.

(Continued)

*Primary Examiner* — Khanh V Nguyen
(74) *Attorney, Agent, or Firm* — Frank D. Cimino

(57) ABSTRACT

Methods, apparatus, systems, and articles of manufacture are disclosed to generate a modulation protocol to output audio. An example apparatus includes a modulation circuit including a first input, a second input, a first output, and a second output; a first gate coupled to the first output of the modulation circuit; a second gate coupled to the second output of the modulation circuit; a first multiplexer including a first input coupled to the first output of the modulation circuit, a second input coupled to the output of the second gate, and an output coupled to a first switch; and a second multiplexer including a first input coupled to the second output of the modulation circuit, a second input coupled to the output of the first gate, and an output coupled to a second switch.

26 Claims, 11 Drawing Sheets

(56) References Cited

U.S. PATENT DOCUMENTS

| | | | |
|---|---|---|---|
| 8,283,979 B2* | 10/2012 | Stanley | H01L 27/0629 330/10 |
| 8,558,609 B2* | 10/2013 | Fang | H03F 99/00 330/10 |
| 9,276,530 B1* | 3/2016 | Liu | H03F 3/2173 |
| 9,473,087 B2 | 10/2016 | Lesso et al. | |
| 10,367,458 B2 | 6/2019 | Azuhata | |
| 2006/0091945 A1 | 5/2006 | Wegner | |
| 2009/0128237 A1 | 5/2009 | Attwood et al. | |
| 2011/0133836 A1* | 6/2011 | Yu | H03F 3/217 330/251 |
| 2011/0254625 A1 | 10/2011 | Kohut et al. | |
| 2014/0203870 A1 | 7/2014 | Williams | |
| 2017/0054416 A1 | 2/2017 | Zhu et al. | |

OTHER PUBLICATIONS

Written Opinion of the Internation Searching Authority for PCT/US2022/044204 dated Jan. 6, 2023; 4 pages.
United States Patent and Trademark Office, Office Action for U.S. Appl. No. 17/491,133, Oct. 23, 2023, 6 pages.

* cited by examiner

METHODS AND APPARATUS TO GENERATE A MODULATION PROTOCOL TO OUTPUT AUDIO

FIELD OF THE DISCLOSURE

This disclosure relates generally to circuits, and, more particularly, to methods and apparatus to generate a modulation protocol to output audio.

BACKGROUND

Amplifiers are used to amplify an audio signal. Because amplifiers may utilize analog and/or digital audio signals, amplifiers with less switching loss, low harmonic distortion, and low electromagnetic interference are desirable to provide the best sound qualities for the audio. Some amplifiers (e.g., class-D amplifiers) use switching devices (e.g., transistors) to generate a modulated signal that corresponds to the audio signal. The modulated signal is passed to an amplifier for outputting the audio. Such switching amplifiers provide efficient and high-power amplification for audio.

DETAILED DESCRIPTION

Figure 1:
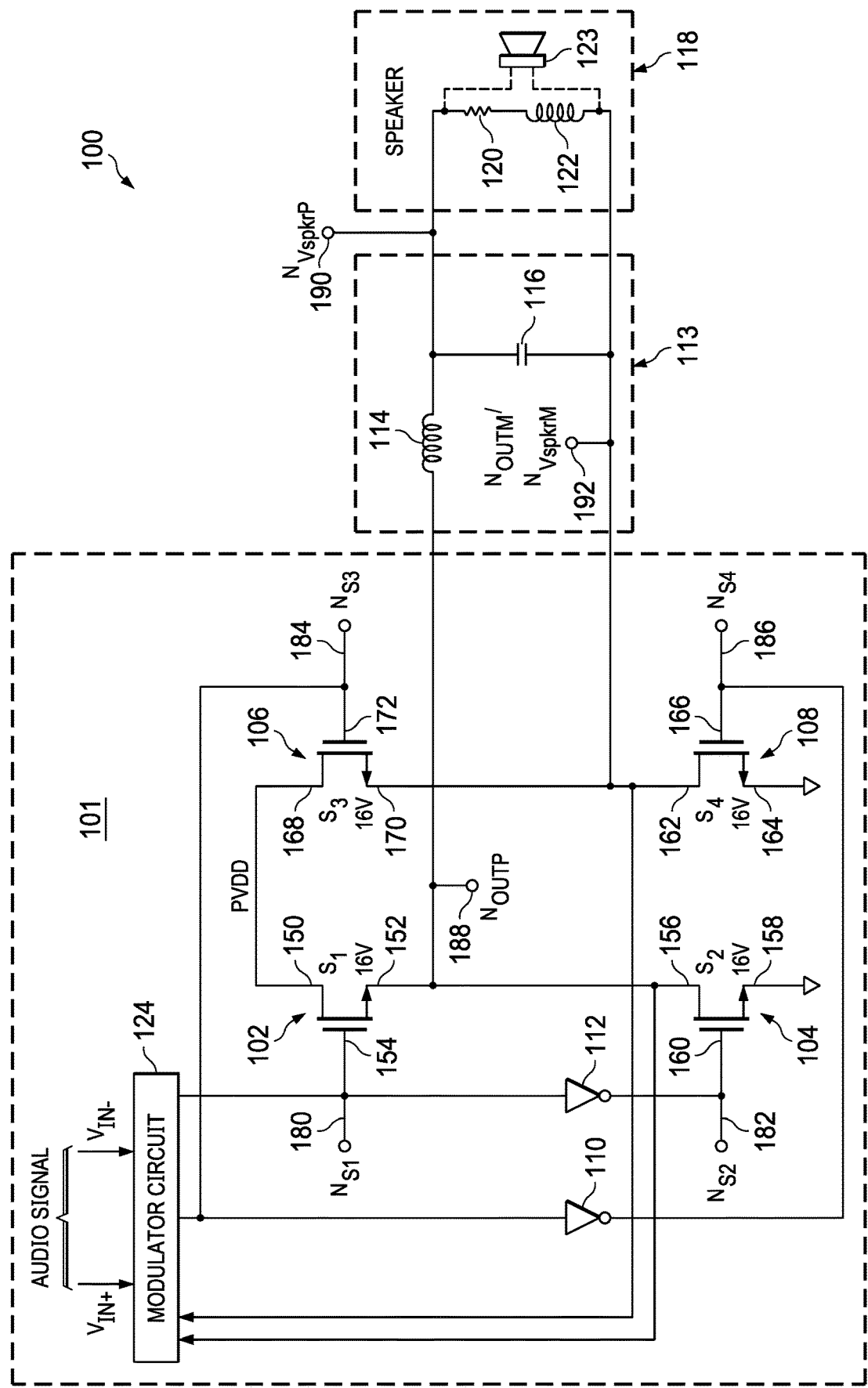
FIG. 1 is an example circuit for outputting one or more signals to an audio amplifier in conjunction with examples disclosed herein.

Switching amplifiers (e.g., class-D amplifiers) are utilized to output audio in various electronics including mobile phones, televisions, hearing aids, home theater systems, vehicle audio systems, instrument amplification, radio frequency amplifiers subwoofers, etc. A switching amplifier includes switches (e.g., transistors) that toggle between two supply rails (e.g., a voltage supply and ground, a supply voltage, and a negative voltage supply, etc.). In such amplifiers, a modulating circuit generates a pulse width modulated signal, a pulse density signal, and/or any other type of control signal to toggle the switches. The outputs of the toggled switches is passed through a filter (e.g., a low pass filter) to generate a sinusoidal signal that is fed to a speaker.

Some switching amplifiers require two sets of inductor (L) capacitor (C) filters at the output of the switching amplifiers to meet electromagnetic interference (EMI) requirements. However, a second LC filter increases silicon space, complexity, and cost. Additionally, if there is a mismatch between the inductance of the first LC filter and the second LC filter, the gains of the voltages at the output nodes of the speaker will be different, which introduces undesired harmonics. For example, if the inductance of the first inductor and the inductance of the second inductor mismatch by 20%, the low side recycling total harmonic distortion (THD) can be −62 decibels (dB) for 6 kilo Hertz (kHz), due to the $2^{nd}$ harmonics caused by the 20% mismatch. Some modulation circuits generate modulation schemes to improve THD results. However, such modulation circuits result in a large switching loss. Other modulation circuits generate modulation schemes to improve switching loss. However, such modulation circuits result in poor THD results. Additionally, both modulation circuits require two LC filters to achieve low EMI.

Examples disclosed herein include a modulation circuit that can meet low EMI requirements while using only one LC filter, thereby reducing the silicon space, cost, complexity, etc. of a switching amplifier. The disclosed modulation circuit generates a switching transition totem pole signal that results in an improved switching loss and THD while getting good EMI results using one LC filter. A totem pole signal is a signal that switches between at least two patterns at a zero crossing of the inductor current (e.g., when the inductor current reaches zero from a positive to a negative current or from a negative to a positive current). A switching transition totem pole signal is a totem pole signal that includes output voltage pulse toggling behavior at output nodes of disclosed modulation circuit around the zero crossing of the inductor current. The toggling behavior corresponding to the voltage pulses results in good THD with very little distortion. The disclosed switching transition totem pole modulation circuit generates four modulated signals (e.g., $D_P$, $D_M$, $1-D_P$, $1-D_M$) and toggles between a first set of the modulated signal (e.g., $D_P$, $D_M$) and a second set of the modulated signals (e.g., $1-D_M$, $1-D_P$) based on whether the voltage across the speaker is positive or negative. Examples disclosed herein further include zero crossing logic to determine when the voltage across the speaker has switched from positive to negative and from negative to positive to adjust toggle between the modulate signal sets.

FIG. 1 illustrates an example system 100 to output a pulse width modulated signal to a speaker using one LC filter. The system 100 includes a circuit 101, an LC filter 113, and a speaker 118. Circuit 101 includes: a modulator circuit 124; inverters 110 and 112 each having respective first and second "inverter" terminals; and transistors 102, 104, 106, 108 each having a respective control terminal and respective first and second transistor terminals and implemented as switches (and thereby also referred to as switches 102, 104, 106, 108). LC filter 113 includes an inductor 114 and a capacitor 116. Speaker 118 includes a resistor 120, an inductor 122, and an amplifier 123. FIG. 1 also illustrates example terminals 150, 152, 154, 156, 158, 160, 162, 164, 166, 168, 170, 172 of some of the system components and some example nodes 180, 182, 184, 186, 188, 190, 192.

The switches (e.g., S1, S2) 102, 104 of FIG. 1 control the voltage at the $N_{OUTP}$ node 188. In the illustrated example of FIG. 1, the switches 102, 104 are n-channel metal oxide semiconductor (NMOS) field effect transistors (FETs). However, the switches 102, 104 can be any type of transistor (e.g., p-channel MOSFET (PMOS), bipolar junction transistor (BJT), etc.) or component capable of acting as a switch (e.g., to operate as an open circuit or a closed circuit). The switch S1 102 includes the first transistor terminal 150 (e.g., a current terminal, a drain terminal, etc.) coupled to a power supply (e.g., PVDD). The switch S1 102 further includes the second transistor terminal 152 (e.g., a current terminal, a source terminal, etc.) coupled to the $N_{OUTP}$ node 188, the first transistor terminal 156 of the second switch 104, and the modulator circuit 124. The switch S1 102 further includes the control terminal 154 (e.g., the gate terminal) coupled to the input of the inverter 112, the modulator circuit 124, and the node $N_{S1}$ 180. The switch S2 104 includes the first transistor terminal 156 (e.g., a current terminal, a drain terminal, etc.) coupled to the $N_{OUTP}$ node 188, the second transistor terminal 152 of the first switch 102, and the modulator circuit 124. The switch S2 104 further includes the second transistor terminal 170 (e.g., a current terminal, a source terminal, etc.) coupled to ground. The switch S2 104 further includes the control terminal 160 (e.g., the gate terminal) coupled to an output of the inverter 112 and the node $N_{S2}$ 182.

In the example of FIG. 1, the first switch 102 and the second switch 104 are NMOSs and the signal that is applied to their respective gate terminals 154, 160 is inverted due to the inverter 112. Accordingly, when the first switch 102 is on or enabled, the second switch 104 is off or disabled, and vice versa. However, there may be other ways to structure the switches 102, 104 so that when one is enabled the other is disabled. For example, the inverter 112 may be removed and one of the switches 102, 104 could be replaced with a PMOS (e.g., so that the switches 102, 104 operate as a complementary MOSFET (CMOS)).

The switches (e.g., S3, S4) 106, 108 of FIG. 1 control the voltage at the $N_{OUTM}/N_{VspkrM}$ node 192. In the illustrated example of FIG. 1, the switches 106, 108 are NMOS transistors. However, the switches 106, 108 can be any type of transistor (e.g., p-channel MOSFET, BJT, etc.) or component capable of acting as a switch (e.g., to provide an open circuit or a closed circuit). The switch S3 106 includes the first transistor terminal 168 (e.g., a current terminal, a drain terminal, etc.) coupled to a power supply (e.g., PVDD). The switch S3 106 further includes the second transistor terminal 170 (e.g., a current terminal, a source terminal, etc.) coupled to the $N_{OUTM}$ node 192, the first transistor terminal 168 of the third switch 106, and the modulator circuit 124. The switch S3 106 further includes the control terminal 172 (e.g., the gate terminal) coupled to an input of the inverter 110, the modulator circuit 124, and the node $N_{S3}$ 184. The switch S4 108 includes the first transistor terminal 162 (e.g., a current terminal, a drain terminal, etc.) coupled to the $N_{OUTM}$ node 192, the second transistor terminal 170 of the third switch 106, and the modulator circuit 124. The switch S4 108 further includes the second transistor terminal 164 (e.g., a current terminal, a source terminal, etc.) coupled to ground. The switch S4 108 further includes the control terminal 166 (e.g., the gate terminal) coupled to an output of the inverter 110 and the node $N_{S4}$ 186.

In the example of FIG. 1, the third switch 106 and the fourth switch 108 are NMOSs and the signal that is applied to their respective gate terminals 172, 166 is inverted due to the example inverter 110. Accordingly, when the third switch 106 is on or enabled, the fourth switch 108 is off or disabled, and vice versa. However, there may be other ways to structure the switches 106, 108 so that when one is enabled the other is disabled. For example, the inverter 110 may be removed and one of the switches 106, 108 could be replaced with a PMOS (e.g., so that the switches 106, 108 operate as a CMOS).

The output of the switches 102, 104 of FIG. 1 at the node $N_{OUTP}$ 188 and the output of the switches 106, 108 at the node $N_{OUTM}/N_{VspkrM}$ 192 are filtered by the LC filter 113 (e.g., corresponding to the inductor 114 and the capacitor 116). The inductor 114 is structured to be coupled to the second transistor terminal 152 of the first switch 102 and the first transistor terminal 156 of the second switch 104 via the $N_{OUTP}$ node 188. Additionally, the inductor 114 is coupled to the speaker 118 and the capacitor 116 via the $N_{VspkrP}$ node 190. The capacitor 116 is coupled to the inductor 114 and the speaker 118 via the $N_{VspkrP}$ node 190. The capacitor 116 is also coupled to the speaker 118 via the $N_{OUTM}/N_{VspkrM}$ node 192. Additionally, the capacitor 116 is structured to be coupled to the second transistor terminal 170 of the third switch 106 and the first transistor terminal 162 of the fourth switch 108 via the $N_{OUTM}/N_{VspkrM}$ node 192. The inductor 114 and capacitor 116 filter the modulated signal output at the $N_{OUTP}$ node 118 into a switching transition totem pole-based sinusoidal signal at the $N_{VspkrP}$ node 190 that is output to the speaker 118 to output corresponding audio. Additionally, the inductor 114 and capacitor 116 reduce EMI.

The speaker 118 of FIG. 1 includes the resistor 120, the inductor 122, and the amplifier 123. In some examples, the location of the resistor 120 and the inductor 122 are swapped. In some examples, the speaker 118 may include additional or alternative circuitry. The speaker 118 outputs, via the amplifier 123, an audio signal corresponding to a voltage difference between the $N_{VspkrP}$ node 190 and the $N_{OUTM}/N_{VspkrM}$ node 192.

The modulator circuit 124 of FIG. 1 generates the control signals (e.g., modulated signals) that are applied to the control terminal 154 of the first switch 102 and the control terminal 172 of the third switch 106. Additionally, an inverted version of the modulated signals are applied to the control terminal 160 of the second switch 104 (e.g., via the inverter 112) and the control terminal 166 of the fourth switch 108 (e.g., via the inverter 110). The modulator circuit 124 generates the control signals based on the audio signal as a positive voltage input ($V_{IN+}$), a negative voltage input ($V_{IN-}$), and feedback data corresponding to the voltages at the $N_{OUTP}$ node 188 and the $N_{OUTM}/N_{VspkrM}$ node 192.

The modulator circuit 124 generates a switching transition totem pole modulated signal to control the first and second switches 102, 104. As further described below, the switching transition totem pole corresponds to four modulated signals. The first modulated signal ($D_P$) corresponds to a first sinusoid at the $N_{VspkrP}$ node 190, the second modulated signal ($D_M$) corresponds to a 0 V signal at the $N_{OUTM}/N_{VspkrM}$ node 192, the third modulated signal ($1-D_M$) is the inverse of the second modulated signal and corresponds to a second sinusoid at the $N_{VspkrP}$ node 190, and the fourth modulated signal ($1-D_P$) is the inverse of the first modulated signal and corresponds to a 14 V signal at the $N_{OUTM}/N_{VspkrM}$ node 192.

For a first duration of time, the modulator circuit 124 outputs the first modulated signal ($D_P$) to the node $N_{S1}$ 180 and outputs the second modulated signal ($D_M$) to the $N_{S3}$ node 184. For a second duration of time, the modulation circuit 124 outputs the third modulated signal ($1-D_M$) to the node $N_{S1}$ 180 and outputs the fourth modulated signal ($1-D_P$) to the $N_{S3}$ node 184. Example graphs corresponding to the signals at various nodes of the example system 100 are further described below in conjunction with FIGS. 6-8. The modulation circuit 124 determines when to switch from the first duration to the second duration and vice versa based on zero toggle crossing of the voltage(s) corresponding to at least one of the node $N_{OUTP}$ 188 or the node $N_{OUTM}$ 192. The modulation circuit 124 is further described below in conjunction with FIG. 2.

Figure 2:
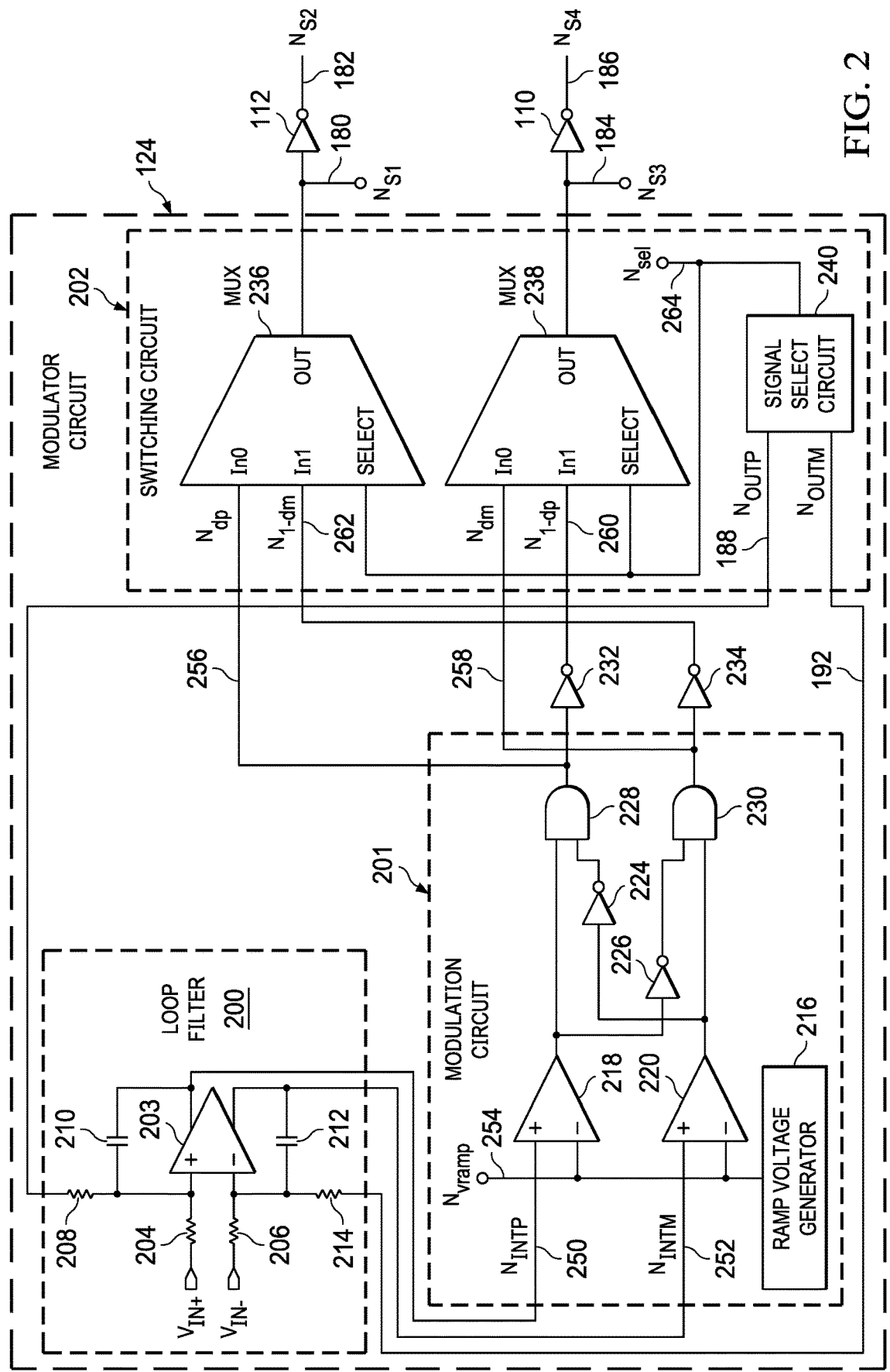
FIG. 2 is an example implementation of a circuit to implement a modulator circuit of FIG. 1.

FIG. 2 is an example circuit diagram of the modulator circuit 124 of FIG. 1. Also shown in FIG. 2 are the inverters 110, 112 and the nodes 180, 182, 184, 186, 188, and 192 of FIG. 1. The modulator circuit 124 includes a loop filter 200, a modulation circuit 201, a switching circuit 202, and inverters 232 and 234. The loop filter 200 includes a differential amplifier 203, resistors 204, 206, 208, 214, and capacitors 210, 212. The modulation circuit 201 includes a ramp voltage generator 216, comparators 218, 220, inverters 224, 226, and logic gates 228, 230. The modulation circuit 201 is coupled to inverters 232, 234. The switching circuit 202 includes multiplexers (MUXs) 236, 238 and a signal select circuit 240. The modulator circuit 124 further includes example nodes 250, 252, 254, 256, 258, 260, 262, 264.

The loop filter 200 of FIG. 2 obtains the audio signal as the positive input voltage ($V_{IN+}$) and the negative input voltage ($V_{IN-}$). The positive input voltage is passed into the positive terminal of the differential amplifier 203 via the resistor 204, and the negative input voltage is passed into the negative terminal of the differential amplifier 203 via the resistor 206. Additionally, the voltage at the $N_{OUTP}$ node 188 of FIG. 1 is fed into the positive terminal of the differential amplifier 203 via the resistor 208, and the voltage at the $N_{OUTM}$ node 192 is fed into the negative terminal of the differential amplifier 203 via the resistor 214. Additionally, the first output (e.g., at the $N_{INTP}$ node 250) is fed back into the positive terminal of the differential amplifier 203 via the capacitor 210, and the second output (e.g., at the $N_{INTM}$ node 252) is fed back into the negative terminal of the differential amplifier 203 via the capacitor 212.

The resistors 204, 208 reduce the voltage at the $N_{OUTP}$ node 188 to a similar level as the positive input voltage at the positive input terminal of the differential amplifier 203. The resistors 206, 214 reduce the voltage at the $N_{OUTM}$ node 192 to a similar level as the negative input voltage at the negative input terminal of the differential amplifier 203. The differential amplifier 203 outputs the first output voltage at the $N_{INTP}$ node 250 and the second output voltage at the $N_{INTM}$ node 252. The first and second output voltages correspond to the difference between the voltages at the positive terminal and the negative terminal times some gain amount (e.g., (V at $N_{INTP}$ 250–V at $N_{INTM}$ 252)=A (V at positive terminal–V at negative terminal), where A is the gain). The outputs of the loop filter at the nodes $N_{INTP}$ 250 and $N_{INTM}$ 252 are respectively coupled to the positive terminals of the comparators 218, 220 of the modulation circuit 201.

The modulation circuit 201 of FIG. 2 generates the modulated signals (e.g., $D_P$, $D_M$) and the inverters 232, 234 generate the modulated signals (e.g., $1-D_P$, $1-D_M$) that are applied to the switches 102, 104, 106, 108 of FIG. 1. The modulation circuit 201 generates the two modulated signals ($D_P$ and $D_M$) based on comparisons of the outputs of the loop filter 200 to a ramp signal. The ramp voltage generator 216 generates the ramp signal. For example, the ramp voltage generator 216 is a voltage driver that outputs a ramp signal. An example of the ramp signal is described below in conjunction with FIG. 7. The ramp voltage generator 216 is coupled to the negative terminals of the comparators 218, 220 via the $N_{Vramp}$ node 254.

As described above, the first output of the loop filter 200 is coupled to the positive terminal of the comparator 218 via the node $N_{INTP}$ 250, and the second output of the loop filter is coupled to the positive terminal of the comparator 220 via the node $N_{INTM}$ 252. The comparator 218 outputs a logic high (e.g., corresponding to the voltage supply, '1', etc.) when the voltage at the $N_{INTP}$ terminal 150 is higher than the voltage at the $N_{Vramp}$ node 254 and outputs a logic low (e.g., corresponding to ground, '0', etc.) when the voltage at the $N_{INTP}$ node 150 is lower than the voltage at the $N_{Vramp}$ node 254. The output of the comparator 218 is coupled to a first input of the logic gate 228 and the input of the inverter 226.

The comparator 220 outputs a logic high (e.g., corresponding to the voltage supply, '1', etc.) when the voltage at the $N_{INTM}$ node 252 is higher than the voltage at the $N_{Vramp}$ node 254 and outputs a logic low (e.g., corresponding to ground, '0', etc.) when the voltage at the $N_{INTM}$ node 152 is lower than the voltage at the $N_{Vramp}$ node 254. The output of the comparator 220 is coupled to a second input of the logic gate 230 and the input of the inverter 224.

The inverters 224, 226 of FIG. 2 (e.g., logic NOT gates) invert the logic output by the respective comparators 218, 220. For example, if the comparator 218 outputs a logic low (e.g., "0", 0 V, etc.), the inverter 226 outputs a logic high (e.g., "1", 5 V, etc.). Likewise, if the comparator 218 outputs a logic low (e.g., "1", 5 V, etc.), the inverter 224 outputs a logic low (e.g., "0", 0 V etc.). The output of the inverter 224 is coupled to the second input of the logic gate 228, and the output of the inverter 226 is coupled to the first input of the logic gate 230.

The logic gate 228 generates the first modulated signal $D_P$ at the node $N_{DP}$ 256, and the logic gate 230 generates the second modulated signal $D_M$ at the node $N_{DM}$ 258. The logic gates 228, 230 are logic AND gates. Accordingly, when the output of the comparator 218 and the output of the inverter 224 are both logic high, the output of the logic gate 228 is high. If either or both of the outputs of the comparator 218 and the inverter 224 are low, the output of the logic gate 228 is low. Likewise, when the output of the comparator 220 and the output of the inverter 226 are both logic high, the output of the logic gate 230 is high. If either or both of the outputs of the comparator 220 and the inverter 226 are low, the output of the logic gate 230 is low.

The output of the logic gate 228 is coupled to the input of the inverter 232 and the first input of the MUX 236 via the $N_{DP}$ node 256. The output of the logic gate 230 is coupled to the input of the inverter 234 and the first input of the MUX 238 via the $N_{DM}$ node 258. The inverter 232 (e.g., a logic NOT gate) generates the fourth modulated signal by inverting the first modulated signal from $D_P$ to $1-D_P$. The inverter 242 (e.g., a logic NOT gate) generates the third modulated signal by inverting the second modulated signal from $D_M$ to $1-D_M$. The output of the inverter 232 is coupled to the second input of the MUX 238 via the $N_{1-DP}$ node 260. The output of the inverter 234 is coupled to the second input of the MUX 236 via the $N_{1-DM}$ node 262.

The MUX 236 outputs the first modulated signal $D_P$ or the third modulated signal $1-D_M$ based on the voltage at the select input of the MUX 236. The select input is coupled to the signal select circuit 240 via the $N_{SEL}$ node 264. In this manner, when the voltage output by the signal select circuit 240 corresponds to a first voltage (e.g., logic low, 0 V, etc.), the MUX 236 outputs the $D_P$ signal, and when the voltage output by the signal select circuit 240 corresponds to a second voltage (e.g., logic high, 5 V, etc.), the MUX 236 outputs the $1-D_M$ signal.

The MUX 238 outputs the second modulated signal $D_M$ or the fourth modulated signal $1-D_P$ based on the voltage at the select input of the MUX 238. The select input is coupled to the signal select circuit 240 via the $N_{SEL}$ node 264. In this manner, when the voltage output by the signal select circuit 240 corresponds to a first voltage (e.g., logic low, 0 V, etc.), the MUX 238 outputs the $D_M$ signal, and when the voltage output by the signal select circuit 240 corresponds to a second voltage (e.g., logic high, 5 V, etc.), the MUX 238 outputs the $1-D_P$ signal.

The output of the MUX 236 is coupled to the control terminal 154 of the first switch 102 via the $N_{S1}$ node 180 and the input of the inverter 112 (e.g., which is coupled to the control terminal 160 of the second switch 104 via the $N_{S2}$ node 182). The output of the MUX 238 is coupled to the control terminal 172 of the third switch 106 via the $N_{S3}$ node 184 and the input of the inverter 110 (e.g., which is coupled to the control terminal 166 of the fourth switch 108 via the $N_{S4}$ node 186).

The signal select circuit 240 of FIG. 2 is a signal select generator that includes two inputs and one output. The first input of the signal select circuit 240 is coupled to the $N_{OUTP}$ node 188. The second input of the signal select circuit 240 is coupled to the $N_{OUTM}$ node 192. The output is the signal select circuit 240 is coupled to the respective select inputs of the MUXs 236, 238 via the $N_{SEL}$ node 264. The signal select circuit 240 compares the voltage at the $N_{OUTP}$ node 188 with the voltage at the $N_{OUTM}$ node 192 to determine a zero voltage crossing. A zero voltage crossing occurs when the voltage drop across the speaker 118 switches from positive to negative or from negative to positive.

As (e.g., responsive to) the zero voltage crossing occurs, the voltage at the $N_{OUTP}$ node 188 and the voltage at the $N_{OUTM}$ node 192 changes patterns. For example, when the voltage at the $N_{OUTP}$ node 188|[CM1] is changing from a positive voltage to a negative voltage, the rate of output pulses at $N_{OUTP}$ 188 decreases to zero. At the same time, the rate of output pulses at the $N_{OUTM}$ node 192 increases from zero to some rate. The signal select circuit 240 monitors the pulses at both the $N_{OUTP}$ node 188 and the $N_{OUTM}$ node 192 to determine the zero crossing. The signal select circuit 240 responsively switches the output voltage from a low to high when the voltage at the $N_{OUTP}$ node 188 reaches zero and responsively switches the output voltage a low to a high when the voltage at the $N_{OUTM}$ node 192 reaches zero.

Because switching at the first sign of a pulse may cause distortion, the signal select circuit 240 may wait to transition from one voltage to another voltage until a threshold number of pulses at the $N_{OUTM}$ node 192 have been sensed without a pulse at the $N_{OUTP}$ node 188. For example, as the voltage at the $N_{OUTP}$ node 188 is approaching zero, the signal select circuit 240 may wait for five pulses from the $N_{OUTM}$ node 192 without a pulse from the $N_{OUTP}$ node 188 before switching the output. An example of the signal select circuit 240 is further described below in conjunction with FIG. 3.

Figure 3:
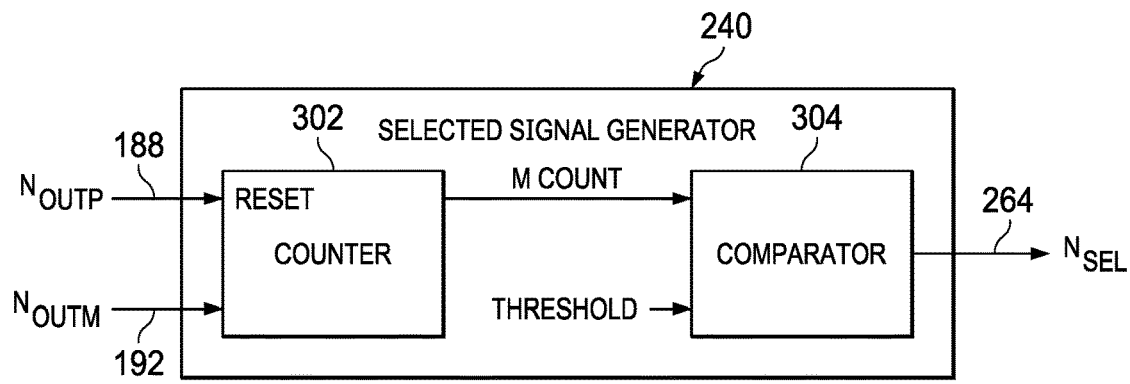
FIG. 3 is an example implementation of a block diagram to implement a signal select circuit of FIG. 2.

FIG. 3 is an example block diagram of the signal select circuit 240 of FIG. 1. The signal select circuit 240 includes a counter 302 and a comparator 304. Signal select circuit 240 is also referred to herein as a selected signal generator 240.

The counter 302 of FIG. 3 counts the number of pulses at the $N_{OUTM}$ node 192. The counter 302 outputs the count of the pulses on the $N_{OUTM}$ node 192 (e.g., M count) to the comparator 304. Additionally, the counter 302 includes a reset input coupled to the $N_{OUTP}$ node 188. In this manner, the voltage at the $N_{OUTP}$ node 188 acts as a reset signal. As described above, during a zero crossing there may be voltage pulses on both the $N_{OUTP}$ node 188 and the $N_{OUTM}$ node 192. Accordingly, when the counter 302 senses a voltage pulse at the $N_{OUTP}$ node 188, the counter 302 resets the count back to 0. In this manner, the signal select circuit 240 switches the select input after the transition from a positive to a negative voltage, or vice versa, across the speaker 118 while reducing zero crossing distortion.

The comparator 304 of FIG. 3 is coupled to the counter 302 (e.g., to obtain the M count) and to the select inputs of the MUXs 236, 236 via the $N_{SEL}$ node 264. The comparator 304 further includes an input that obtains a signal corresponding to a threshold count (e.g., the threshold number of pulses needed to adjust from one select value to a second select value). The comparator 304 generates the select signal (e.g., a logic high or logic low, 0V or 5 V, etc.) based on the M count. When the M count is below a threshold amount (e.g., 4), the comparator 304 outputs a first voltage (e.g., 0 V or 5 V, depending on whether the voltage across the speaker 118 is switching from a negative voltage to a positive voltage or a positive voltage to a negative voltage). When the M count reaches the threshold amount, the comparator 304 changes the output voltage from the first voltage to a second voltage (e.g., 5 V or 0 V). For example, when the comparator 304 is outputting the first voltage and the M count reaches the threshold amount (e.g., 4), the comparator 304 transitions from the first voltage (e.g., 0 V) to the second voltage (e.g., 5 V). When the comparator 304 is outputting the second voltage and the M count reaches the threshold amount, the comparator 304 transitions from the second voltage to the first voltage. In this manner, the output voltage causes the MUXs 236, 238 to adjust the respective outputs from the first input to the second input, as described above in conjunction with FIG. 2.

Figure 4:
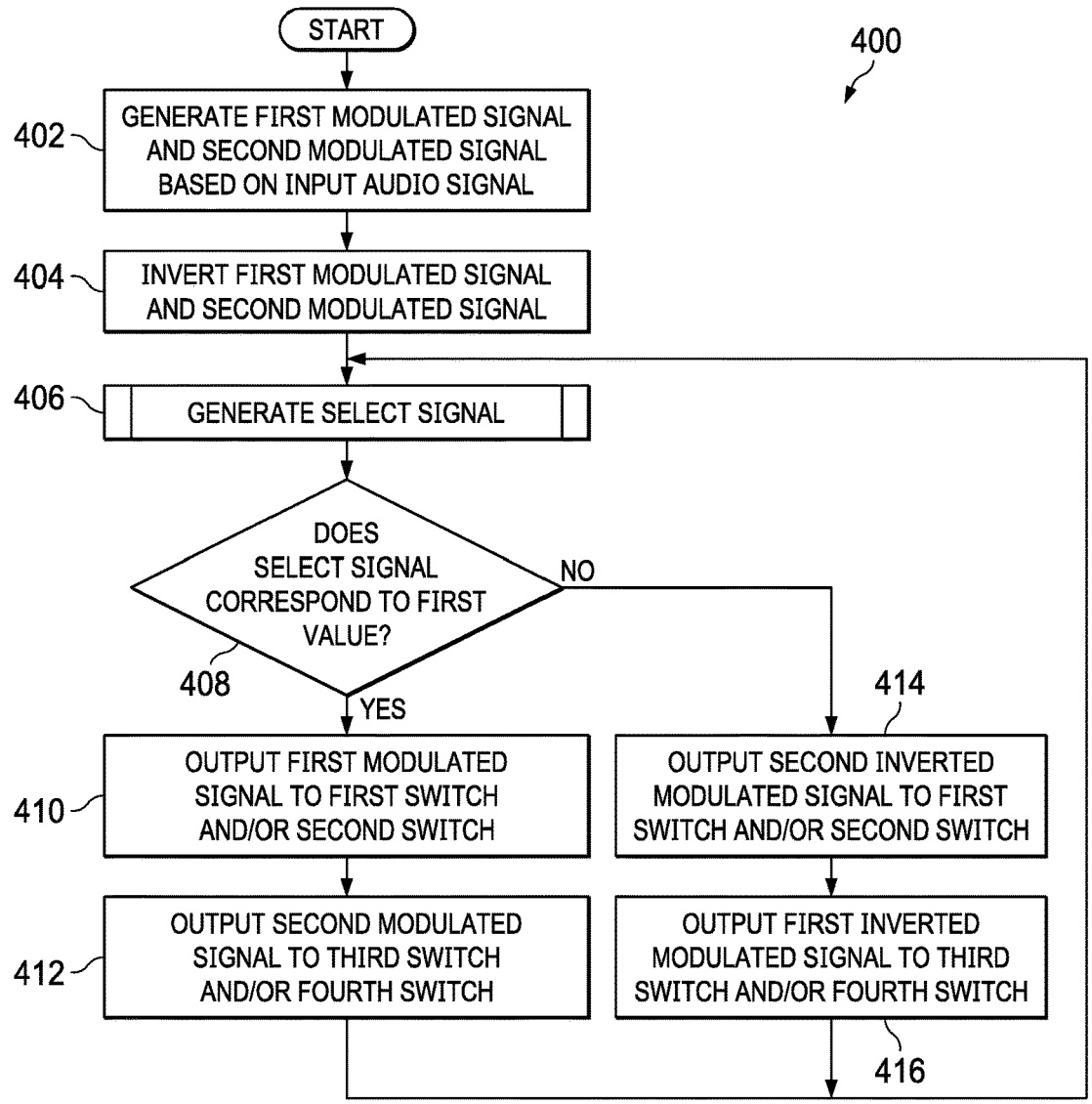
FIGS. 4-5 are flowcharts representative of machine readable instructions which may be executed to implement the modulator circuit of FIGS. 1-3.

FIG. 4 is an example flowchart representative of example machine readable instructions 400 that may be executed by the modulator circuit 124 of FIGS. 1-3 to generate a modulated signal (e.g., a switching transition totem pole modulated signal) used to output audio via the speaker 118. Although the instructions of FIG. 4 are described in conjunction with the modulator circuit 124 in the system 100 of FIGS. 1-3, the instructions may be described in conjunction with any type of modulator circuit in any type of system.

At block 402, the example modulation circuit 201 generates the first modulated signal (e.g., $D_P$) and the second modulated signal (e.g., $D_M$) based on the input audio signal (e.g., $V_{IN+}$ and $V_{IN-}$). As described above, the input audio signal (e.g., $V_{IN+}$ and $V_{IN-}$) is filtered through the example loop filter 200 using the voltages at the Noup node 188 and the $N_{OUTM}$ node 192. The filtered signals are compared to a ramp voltage and passed through logic gates (e.g., inverters 224, 226 and logic gates 228, 230) to generate the first modulated signal and the second modulated signal. The first modulated signal is provided at the first input of the MUX 236, and the second modulated signal is provided at the first input of the MUX 238.

At block 404, the inverter 232 inverts the first modulated signal ($D_P$) to generate a fourth modulated signal (e.g., $1-D_P$), and the inverter 234 inverts the second modulated signal ($D_M$) to generate a third modulated signal ($1-D_M$). The inverted signal corresponding to the first modulated signal (e.g., the fourth modulated signal, $1-D_P$) is provided at the second input of the MUX 238 and the inverted signal corresponding to the second modulated signal (e.g., the third modulated signal, $1-D_M$) is provided at the second input of the MUX 236.

At block 406, the signal select circuit 240 generates the select signal, as further described below in conjunction with FIG. 5. The generated select signal is provided at the select inputs of the example MUXs 236, 238. At block 408, the MUXs 236, 238 determine if the select signal from the signal select circuit 240 corresponds to a first value (e.g., a first voltage, 0 V, logic low, etc.). The MUXs 236, 238 determine the value of the select signal based on the voltage applied to the select input. If the MUXs 236, 238 determine that the select signal does not correspond to the first value (e.g., the select signal corresponds to a second value (e.g., a second voltage, 5 V, logic high, etc.)) (block 408: NO), control continues to block 414.

At block 410, the MUX 236 provides the first modulated signal ($D_P$) at the control terminal 154 of the first switch 102 and at the control terminal 160 of the second switch 104 via the inverter 112, in response to the MUXs 236, 238 determining that the select signal corresponds to the first value. In this manner, the signal at the control terminal 154 of the first switch 102 will be $D_P$, and the signal at the control terminal 160 of the second switch 104 will be 1-$D_P$. At block 412, the MUX 238 outputs the second modulated signal ($D_M$) to the control terminal 172 of the third switch 106 and to the control terminal 166 of the fourth switch 108 via the inverter 110. In this manner, the signal at the control terminal 172 of the third switch 106 will be $D_M$, and the signal applied to the control terminal 166 of the fourth switch 108 will be 1-$D_M$.

At block 414, the MUX 236 outputs the second inverted modulated signal (e.g., the third modulated signal (1-$D_M$)) to the control terminal 154 of the first switch 102 and to the control terminal 160 of the second switch 104 via the inverter 112, in response to the MUXs 236, 238 determining that the select signal does not correspond to the first value. In this manner, the signal at the control terminal 154 of the first switch 102 will be 1-$D_M$ and the signal applied to the control terminal 160 of the second switch 104 will be $D_M$.

At block 416, the MUX 238 outputs the first modulated signal (e.g., the fourth modulated signal (1-$D_P$)) to the control terminal 172 of the third switch 106 and to the control terminal 166 of the fourth switch 108 via the inverter 110. In this manner, the signal at the control terminal 172 of the third switch 106 will be 1-$D_P$ and the signal applied to the control terminal 166 of the fourth switch 108 will be $D_P$. In this manner, when the select signal changes from a first signal to a second signal, the modulated signals applied to the switches 102, 104, 106, 108 are switched and inverted (e.g., from $D_P$ to 1-$D_M$ for the first switch 102, from 1-$D_P$ to $D_M$ for the second switch 104, from $D_M$ to 1-$D_P$ for the third switch 106 and from 1-$D_M$ to $D_P$ for the fourth switch 108).

Figure 5:
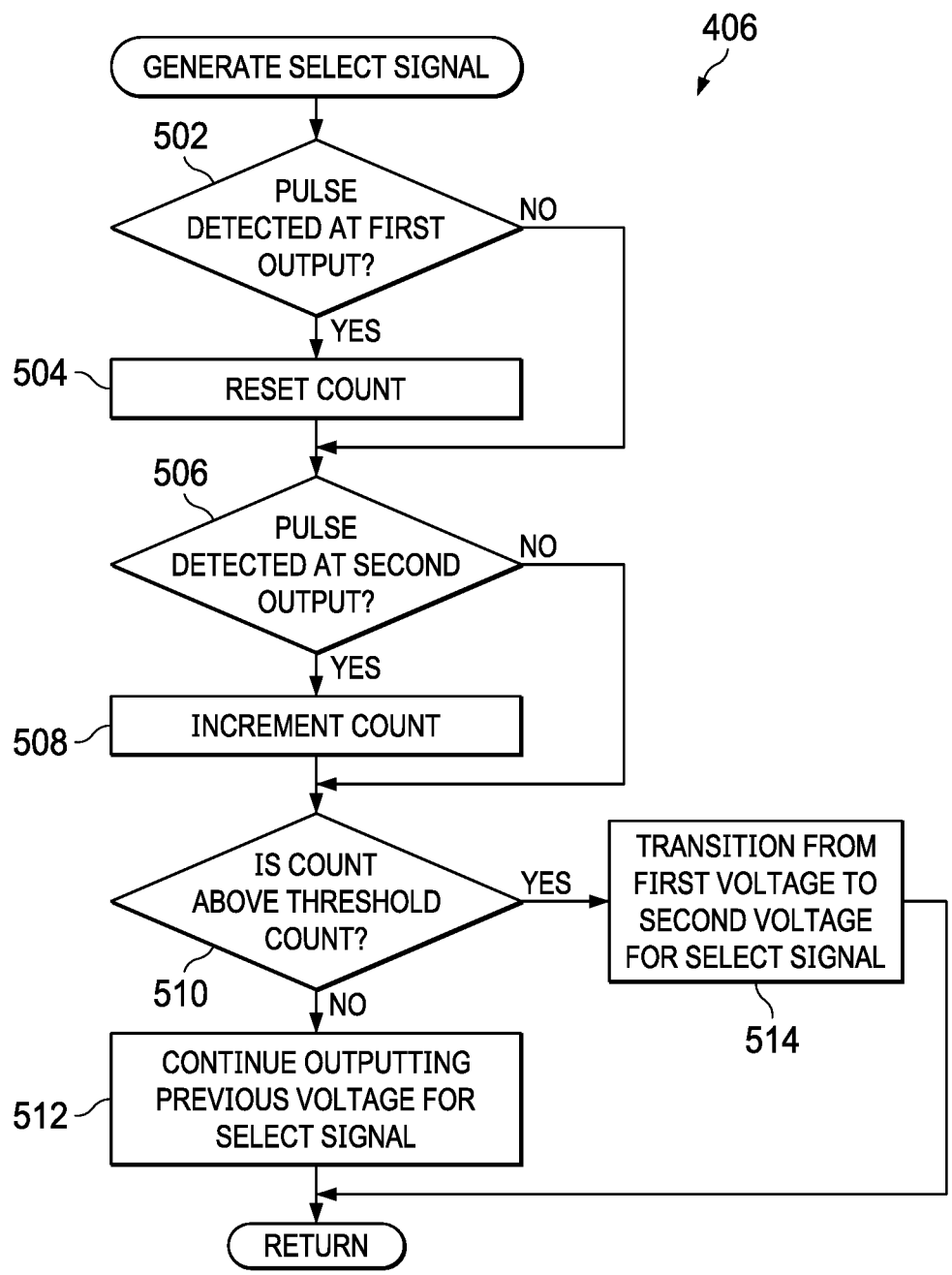

FIG. 5 is an example flowchart representative of example machine readable instructions that may be executed by the signal select circuit 240 of FIGS. 2 and/or 3 showing an example implementation of block 406 of FIG. 4. Although the instructions of FIG. 5 are described in conjunction with the signal select circuit 240 of FIGS. 2 and/or 3, the instructions may be described in conjunction with any type of signal select circuit. Initially (e.g., during startup), the signal select circuit 240 may provide either a first voltage (e.g., 0 V) or a second voltage (e.g., 5 V) as the select signal because the output voltage will be adjusted based on the instructions implemented by the signal select circuit 240.

At block 502, the counter 302 determines if a pulse was detected at the first output (e.g., at the $N_{OUTP}$ node 188 of FIG. 1 via the reset input of the counter 302). If the counter 302 determines that a pulse was not detected at the first output (block 502: NO), control continues to block 506. At block 504, the counter 302 resets the count to zero, in response to the counter 302 determining that a pulse was detected at the first output. At block 506, the counter 302 determines if a pulse was detected at the second output (e.g., at the $N_{OUTM}$ node 192 of FIG. 1). If the counter 302 determines that a pulse was not detected at the second output (block 506: NO), control continues to block 510. At block 508, the counter 302 increments a count corresponding to the M count, in response to the counter 302 determining that a pulse was detected at the second output.

At block 510, the comparator 304 determines if the count (e.g., the M count) is above the threshold count (e.g., satisfies the threshold count). At block 512, the comparator 304 continues to output the previous voltage for the select signal, in response to the comparator 304 determining that the count is not above the threshold count and control returns to block 408 of FIG. 4. At block 514, the comparator 304 transitions from first voltage to second voltage for the select signal (e.g., from 0 V to 5 V or from 5 V to 0 V), in response to the comparator 304 determining that the second count is above the threshold count (e.g., satisfies the threshold count) and control returns to block 408 of FIG. 4.

Figure 6:
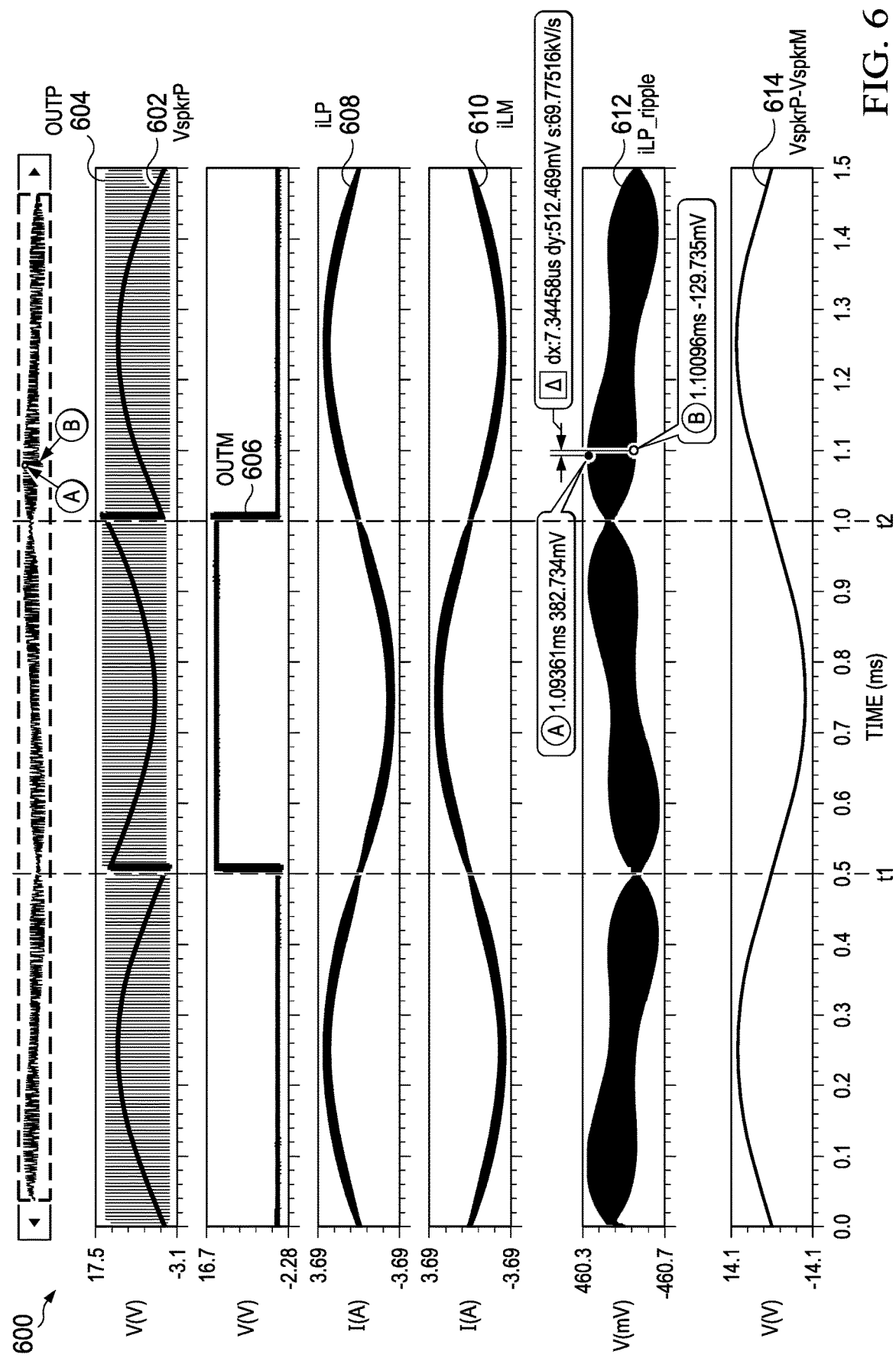
FIGS. 6-8 are example graphs illustrating voltage and/or current plots corresponding to different nodes in the example circuits of FIGS. 1-3.

FIG. 6 illustrates an example graph 600 that includes curves depicting voltages (e.g., nodal voltages with respect to ground) and/or currents that can be measured at various nodes of the circuits of FIG. 1. The curves of graph 600 depict a $V_{spkrP}$ voltage 602 (e.g., corresponding to the voltage at the $N_{VspkrP}$ node 190), an OUTP voltage 604 (e.g., corresponding to the voltage at the $N_{OUTP}$ node 188), an OUTM voltage 606 (e.g., corresponding to the voltage at the $N_{OUTM}$ node 192), an iLP current 608 (e.g., corresponding to the current at the $N_{OUTP}$ node 190), an iLM current 610 (e.g., corresponding to the current at the $N_{OUTM}$ node 192), an iLP_ripple current 612, and a $V_{spkrP}$-$V_{spkrM}$ voltage 614 (e.g., corresponding to the voltage drop across the speaker 118).

Prior to time t1, the modulation circuit 124 controls the switches 102, 104 to generate the modulation signal corresponding to the OUTP voltage 604 (e.g., corresponding to the modulated signal $D_P$). When the OUTP voltage 604 is passed through the LC filter 113, the result is the $V_{spkrP}$ voltage 602 at the $N_{VspkrP}$ node 190. At the same time, the modulation circuit 124 controls the switches 106, 108 to generate the modulated signal corresponding to the OUTM voltage 606 (e.g., 0V). In this manner, the $V_{spkrP}$-$V_{spkrM}$ voltage 614 (e.g., the voltage across the example speaker 118) corresponds to the $V_{spkrP}$ 602 voltage (e.g., $V_{spkrP}$-0 V=$V_{spkrP}$). When the $V_{spkrP}$ voltage 602 reaches zero (e.g., a zero crossing) at time t1, the signal select circuit 240 switches the modulated signals applied to the switches 102, 104, 106, 108. In this manner, the OUTP 604 signal switches to a different modulation signal corresponding to 1-$D_M$ (e.g., where the modulation signals from before time t1 are switched between sets of switches and inverted).

Accordingly, the $V_{spkrP}$ voltage 602 is adjusted to an inverted and shifted version of the signal before time t1. At the same time, the modulation circuit 124 controls the switches 106, 108 to generate the modulated signal corresponding to the OUTM voltage 606 (e.g., 16 V). In this manner, the $V_{spkrP}$-$V_{spkrM}$ voltage 614 (e.g., the voltage across the speaker 118) corresponds to $V_{spkrP}$-16 V. At time t2, the $V_{spkrP}$-$V_{spkrM}$ voltage 614 reaches 0 (e.g., a zero crossing event), and the modulation scheme is adjusted to the same scheme as prior to time t1. The iLP_ripple current 612 shows that the disclosed methods result in a maximum of a 512.469 ampere ripple.

Figure 7:
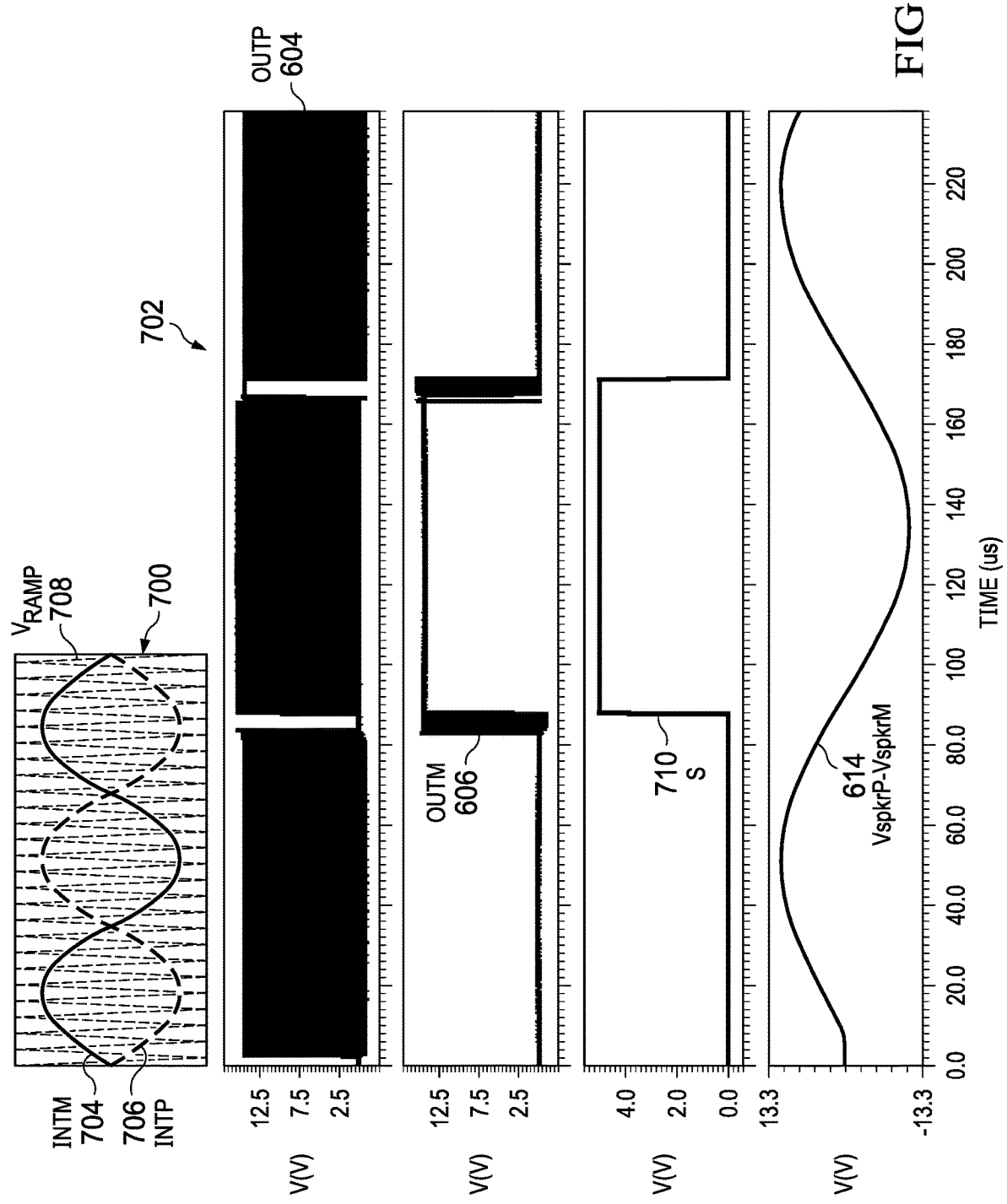

FIG. 7 illustrates example graphs 700, 702 that include curves depicting voltages (e.g., nodal voltages with respect to ground) that can be measured at various nodes of the circuits of FIGS. 1 and/or 2. The graph 700 includes curves depicting an INTM voltage 704 (e.g., corresponding to the voltage at the $N_{INTM}$ node 250), an INTP voltage 706 (e.g., corresponding to the voltage at the $N_{INTP}$ node 252), and a Vramp voltage 708 (e.g., corresponding to the voltage at the $N_{Vramp}$ node 254). The graph 702 includes curves that depict the OUTP voltage 604, the OUTM voltage 606 and the $V_{spkrP}$–$V_{spkrM}$ voltage 614 of FIG. 6. The graph 702 further includes a curve that depicts an S voltage 710 (e.g., corresponding to the voltage at the $N_{SEL}$ node 264 of FIGS. 2 and/or 3.

The INTM voltage 704 and the INTP voltage 706 of the first graph 700 of FIG. 7 illustrate the outputs of the loop filter 200. The $V_{ramp}$ voltage 708 illustrates the signal provided by the ramp voltage generator 216. As described above in conjunction with FIG. 2, the comparator 218 compares the INTP voltage 706 to the $V_{ramp}$ voltage 708, and the comparator 220 compares the INTM voltage 740 to the $V_{ramp}$ voltage 708. The output of the comparator 220 is passed through logic gates (e.g., the inverters 224, 226 and the logic gates 228, 230) to generate the $D_P$ and $D_M$ modulated signals.

The S voltage 710 of the second graph 702 of FIG. 7 illustrates the signal out of the signal select circuit 240. As described above in conjunction with FIG. 6, when the OUTM 606 voltage and the OUTP voltage 604 result in a transition from the voltage across the speaker 118 switching from positive to negative or from negative to positive, the signal select circuit 240 identifies the transition and switches from the 0 V to 5 V to adjust the modulation signals transmitted to the switches 102, 104, 106, 108. An example of the transition is further described below in conjunction with FIG. 8.

Figure 8:
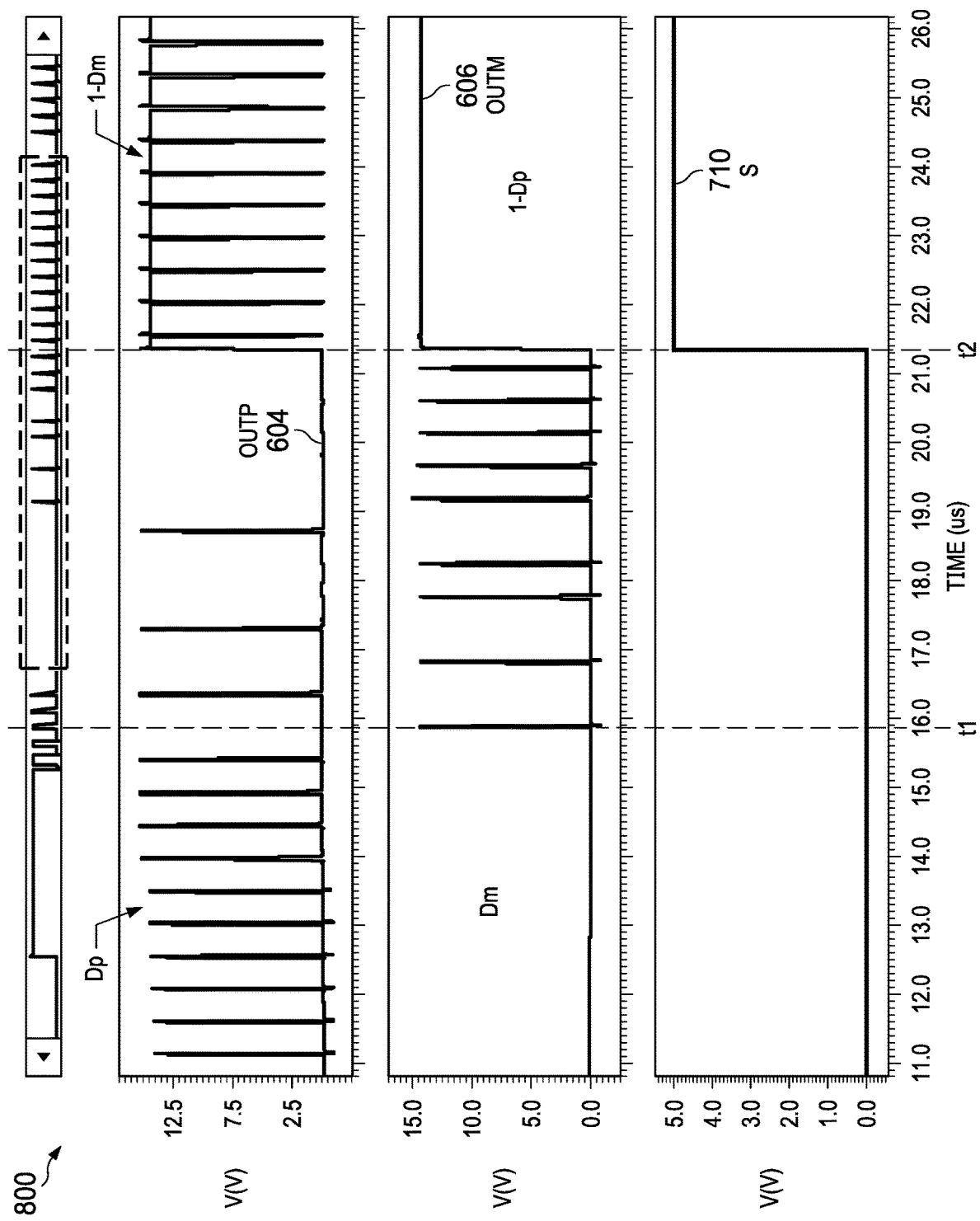

FIG. 8 illustrates example graph 800 that includes curves depicting voltages (e.g., nodal voltages with respect to ground) that can be measured at various nodes of the circuits of FIGS. 1, 2, and/or 3 during a zero crossing event. The graph 800 includes curves depicting the OUTP voltage 604 and the OUTM voltage 606 of FIG. 6 and the S voltage 710 of FIG. 7.

Before time t1, the OUTP voltage 604 of FIG. 7 is generating periodic pulses of 14 V, and the OUTM voltage 606 is 0 V. Accordingly, the M count from the counter 302 of the signal select circuit 240 is zero since the OUTP voltage pulses continually reset the counter 302. Thus, the comparator 304 outputs the S voltage of 0 V to the $N_{SEL}$ node 264, thereby causing the OUTP node 604 to correspond to the first modulated signal $D_P$ at the $N_{S1}$ node 180, and the OUTM node 606 to correspond to the second modulated signal $D_M$ at the $N_{S3}$ node 184.

As described above, as the voltage across the speaker 118 approaches 0 (e.g., adjusting from a positive voltage to a negative voltage), the OUTM voltage 606 begins to pulse while the OUTP voltage 604 is still pulsing for a short duration of time, corresponding to a zero crossing event. Accordingly, at time t1, the OUTM voltage 606 begins to pulse. Between time t1 and t2, whenever the M count is below the threshold and the OUTP voltage 604 pulses, the counter 302 resets, thereby causing the comparator 304 to maintain the previous 0 V signal for the S voltage 710 until more than a threshold number of pulses are sensed at the OUTM voltage 606 without a pulse from the OUTP voltage 604. In the example of FIG. 8, the threshold number of pulses is 5 pulses.

Accordingly, at time t2, when the OUTM voltage 606 pulses 5 times without a pulse from the OUTP voltage 604, the comparator 304 changes the S voltage 710 from 0 V to 5 V. In this manner, after time t2, the MUX 236 provides the third modulated signal (e.g., 1-$D_M$) to the first switch 102 via the $N_{S1}$ node 180, and the MUX 238 provides the fourth modulated signal (e.g., 1-$D_P$) to the third switch 106 via the $N_{S3}$ node 184. The signal select circuit 240 provides the high voltage (e.g., 5 V) signal until the next zero crossing event (e.g., when the voltage changes back from the negative voltage across the speaker 118 to a positive voltage).

Figure 9:
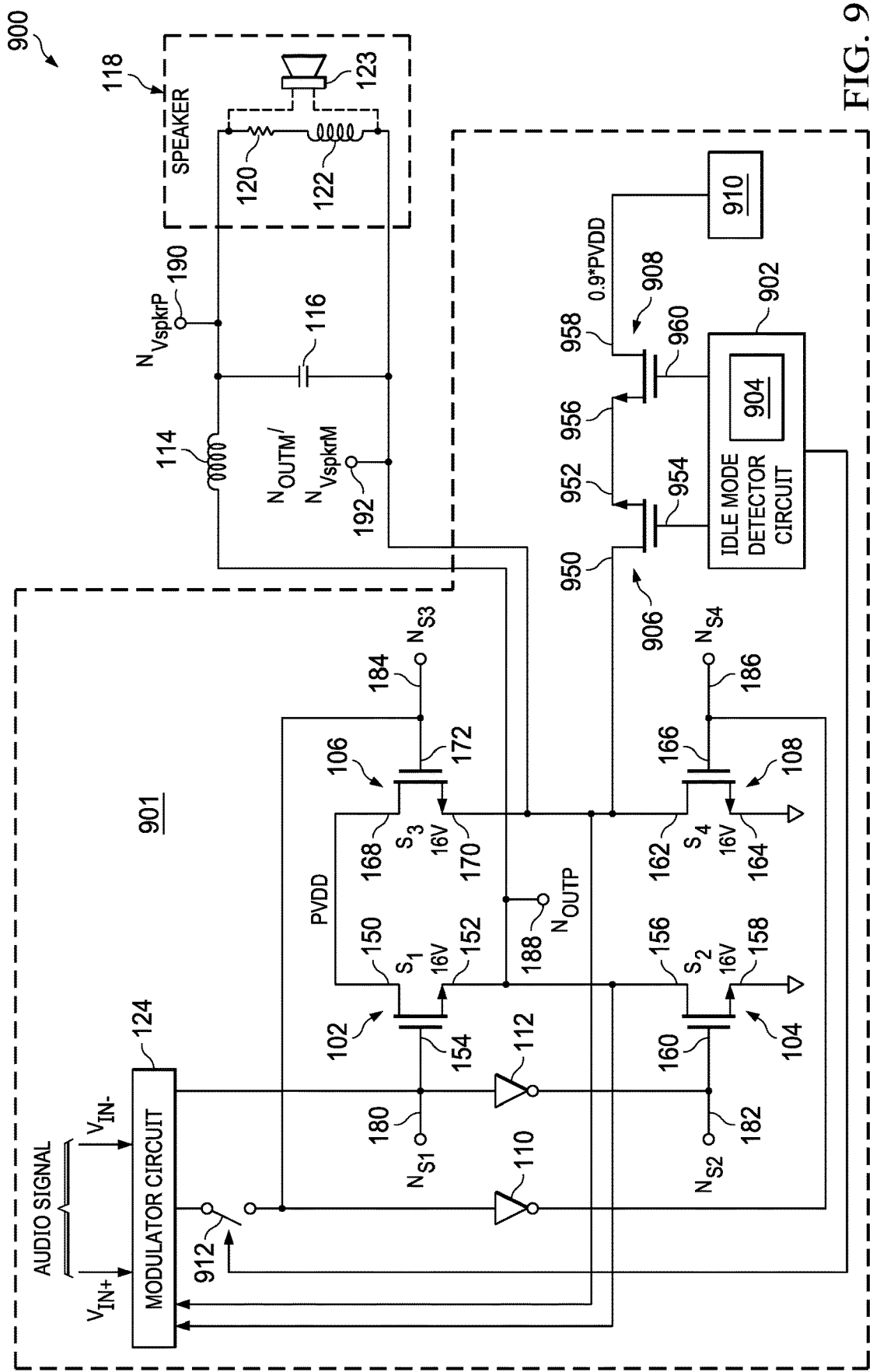
FIG. 9 is an alternative example circuit for outputting one or more signals to an audio amplifier in conjunction with examples disclosed herein.

FIG. 9 illustrates an example system 900 that includes a circuit 901 to output a pulse width modulated signal to a speaker using one LC filter with an idle mode detection. The system 900 further includes the switches 102, 104, 106, 108, inverters 110, 112, the LC filter 113, the inductor 114, the capacitor 116, the speaker 118, the resistor 120, the inductor 122, the amplifier 123, the modulator circuit 124, the component terminals 150, 152, 154, 156, 158, 160, 162, 164, 166, 168, 170, 172, and the nodes 180, 182, 184, 186, 188, 190, 192 of FIG. 1. The system 900 further includes an idle mode detector circuit 902, driver(s) 904, switches 906, 908, a linear regulator 910, a switch 912, and terminals 950, 952, 954, 956, 958, 960.

In the example of FIG. 9, the idle mode detector circuit 902 is coupled to the switch 906 via the control terminal 954 (e.g., a gate terminal) and is coupled to the switch 908 via the control terminal 960 (e.g., a gate terminal). In some examples, the idle mode detector circuit 902 may be coupled to: (a) the $N_{OUTM}$ node 192 (e.g., to measure the voltage at the $N_{OUTM}$ node 192); (b) the modulator circuit 124 and/or a node corresponding to one or more of the input audio signals; and/or (c) any other component in the example 901. The switches 906, 908 are NMOS transistors. However, the switches 906, 908, may be PMOS transistors, BJT transistors, and/or any other type of switch.

The first transistor terminal 950 (e.g., a current terminal, a drain terminal, etc.) of the first switch 906 is coupled to the $N_{OUTM}$ node 192. The second transistor terminal 952 (e.g., a current terminal, a source terminal, etc.) of the first switch 906 is coupled to the first transistor terminal 956 (e.g., a current terminal, a source terminal, etc.) of the second switch 908. The second terminal 958 (e.g., a current terminal, a drain terminal, etc.) of the second switch 908 is coupled to the linear regulator 910 (e.g., a voltage source). Linear regulator 910 provide a voltage that is some fraction (e.g., 0.9) of the positive power rail (e.g., PVDD). In some examples, the linear regulator 910 is a low dropout (LDO) linear regulator. Although the example of FIG. 9 includes the linear regulator 910 providing 0.9 of PVDD, the linear regulator 910 can provide a fraction of PVDD between 0 and 1. In some examples, there may be only one switch as opposed to the two series switches 906 and 908 of FIG. 9.

Idle mode corresponds to when there is no audio output for a duration of time in the audio signal (e.g., the input audio signals are zero). During idle mode, the OUTM voltage 606 and the OUTP voltage 606 both pulse corresponding to a large number of consistent voltage pulse toggling, which can increase EMI because there is no second LC filter at the $N_{OUTM}$ node 192. Accordingly, the idle mode detector circuit 902 detects an idle mode and prevents the pulses at the $N_{OUTM}$ node 192 when the audio output corresponds to idle mode. For example, the idle mode detector circuit 902 detects that the audio signal corresponds to an idle mode by measuring the pulse width of a pulse at the $N_{OUTM}$ node 192. The idle mode detection may be performed via a deglitch of the input audio signal(s) (e.g., a 50 millisecond (ms) deglitch of the input), and/or using any other idle mode detection protocol.

After the idle mode detector circuit 902 detects that the audio signal corresponds to an idle mode, the driver(s) 904 provides a control signal to the respective control terminals 954, 960 of the switches 906, 908. In this manner, the switches 906, 908 are enabled, and the linear regulator 910 provides the 0.9*PVDD to the $N_{OUTM}$ node 192. The driver(s) 904 may include one driver to drive both switches 906, 908 and/or two drivers to each drive one of the switches 906, 908.

Additionally, the idle mode detector circuit 902 may disable the S3 and S4 switches 106, 108 by sending a control signal to the switch 912 that decouples the modulator circuit 124 from the control terminals 172, 166 of the switches 106, 108. In this manner, the voltage at the $N_{OUTM}$ node 192 remains steady around 0.9*PVDD V, thereby preventing voltage pulses at the $N_{OUTM}$ node 192. The switch 912 may be a MOSFET, a BJT, a latch, and/or any other type of switch.

Because the audio signal is idle, the modulator circuit 124 uses the idle input signal and the 0.9*PVDD V at the $N_{OUTM}$ node 192 to generate a modulated signal at the $N_{OUTP}$ node 188 that corresponds to a 90% duty cycle. In this manner, the voltage across the speaker 118 is zero (e.g., for the no audio) without voltage pulses at the $N_{OUTM}$ node 192. The switches 906, 908 are structured to block voltage from both the $N_{OUTM}$ node 192 and from the linear regulator 910 while the switches 906, 908 are disabled (e.g., because the body diode of a single switch only blocks voltage from one direction).

The linear regulator 910 provides some fraction of PVDD (e.g., as opposed to 0V or PVDD) due to the non-ideal components of the system 900. For example, because the components are not ideal, it may be difficult for the voltage at the $N_{OUTP}$ node 188 to provide a modulated signal that exactly matches 0 V or PVDD, leading to EMI issues, audio issues, or other problems. Accordingly, the linear regulator 910 provides some voltage between PVDD and 0 V. Although the linear regulator 910 of FIG. 910 provides 0.9*PVDD, the linear regulator 910 can output a different fraction of the PVDD voltage between 0 and 1 because the modulator circuit 124 can adjust the modulated signal(s) applied to the switches 102, 104 to match the generated fraction of the PVDD.

Figure 10:
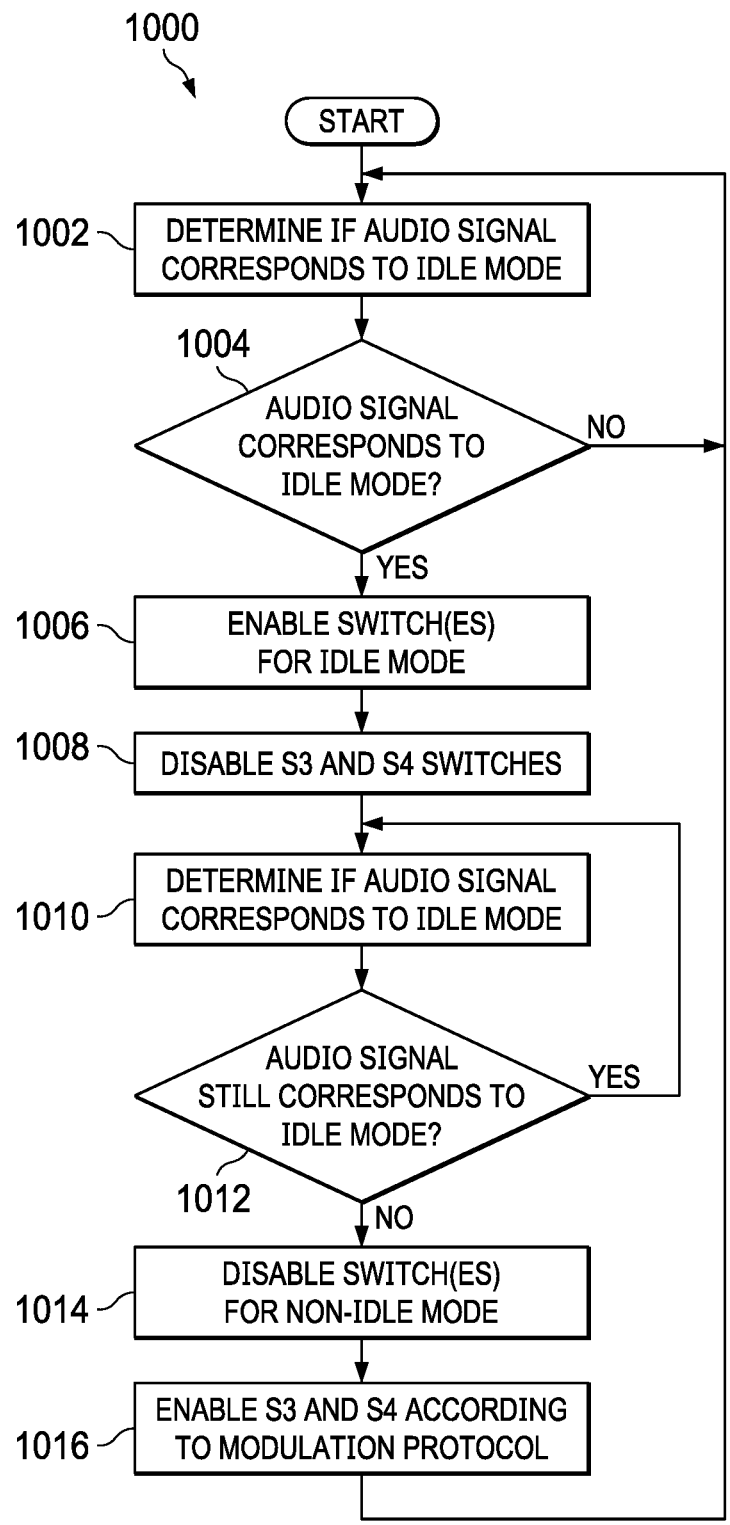
FIG. 10 is a flowchart representative of machine readable instructions which may be executed to implement an example idle mode detector circuit of FIG. 9.

FIG. 10 is an example flowchart representative of example machine readable instructions 1000 that may be executed by the idle mode detector circuit 902 of FIG. 9 to detect an idle mode of the input audio. Although the instructions of FIG. 10 are described in conjunction with the idle mode detector circuit 902 in the system 900 of FIG. 9, the instructions may be described in conjunction with any type of idle mode detector circuit in any type of system.

At block 1002, the idle mode detector circuit 902 determines if the audio signal corresponds to idle mode. For example, the idle mode detector circuit 902 determines that the audio signal corresponds to idle mode when the width of the pulse at the $N_{OUTM}$ node 192 is larger than a threshold amount. The idle mode detection may be performed via a deglitch of the input audio signal(s) (e.g., a 50 ms deglitch of the input), and/or using any other idle mode detection protocol. If the idle mode detector circuit 902 determines that the audio signal does not correspond to an idle mode (block 1004: NO), control returns to block 1002. At block 1006, the driver(s) 904 enable(s) the switches 906, 908 (block 1006), in response to the idle mode detector circuit 902 determining that the audio signal corresponds to an idle mode. The example the driver(s) 904 enable(S) the switches 906, 908 by transmitting a signal to the control terminals 954, 960 of the switches 906, 908, thereby coupling the linear regulator 910 to the $N_{OUTM}$ node 192.

At block 1008, the idle mode detector circuit 902 disables the S3 and S4 switches 106, 108. In some examples, the idle mode detector circuit 902 transmits an instruction to the modulator circuit 124 to disable the S3 and S4 switches 106, 108. In some examples, the driver(s) 904 disable the switches 106, 108 by transmitting one or more control signals to the switch 912 that decouple(s) the switches S3 and S4 906, 908 from the modulator circuit 124. As described above in conjunction with FIG. 9, enabling the switches 906, 908 and disabling the switches 106, 108 results in a constant voltage at the $N_{OUTM}$ 192 node, The constant voltage at the $N_{OUTM}$ 192 node causes the modulator circuit 124 to output a modulated signal to the switches 102, 104 that matches the constant voltage, resulting in no audio or minimum audio output by the speaker 118.

At block 1010, the idle mode detector circuit 902 determines if the audio signal still corresponds to idle mode. If the idle mode detector 902 determines that the audio signal still corresponds to idle mode (block 1012: YES): control returns to block 1010; the switches 906, 908 remain enabled, and the switches 106, 108 remain disabled. However, if the idle mode detector 902 determines that the audio signal no longer corresponds to idle mode (block 1012: NO), the driver(s) 904 disable(s) the switch(es) 906, 908 for the non-idle mode at block 1014, thereby decoupling the linear regulator 910 from the $N_{OUTM}$ node 192.

At block 1016, the idle mode detector circuit 902 enables the S3 and S4 switches 106, 108 according to the modulation protocol implemented by the modulator circuit 124, and control returns to block 1002. For example, if the idle mode detector circuit 902 decoupled the switches 106, 108 from the modulator circuit 124, the idle mode detector circuit 902 enables, via the switch 912, one or more switch(es) to couple the switches 106, 108 back to the modulator circuit 124 for normal operation.

Figure 11:
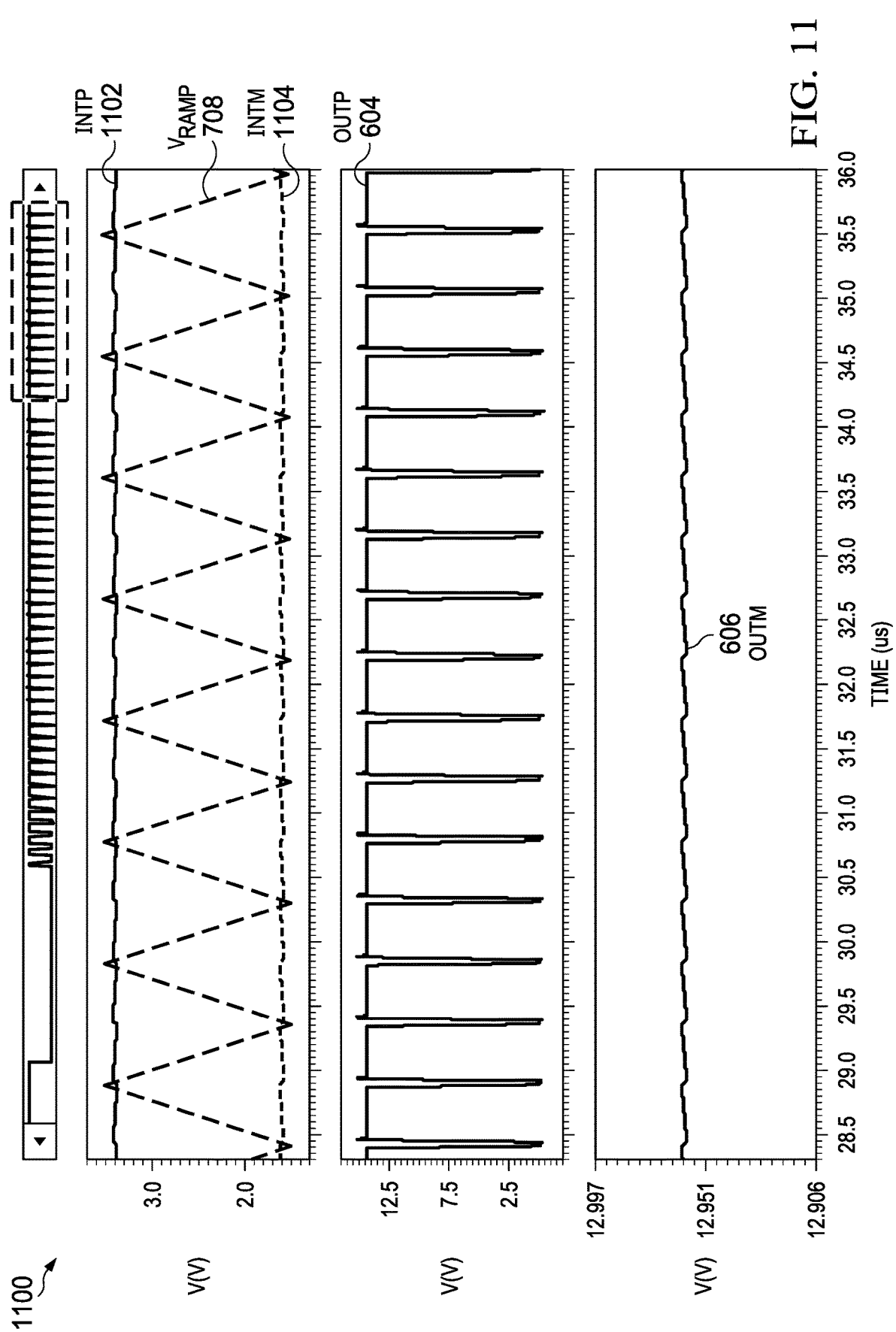
FIG. 11 is an example graph illustrating voltage plots corresponding to different nodes in the example circuit of FIG. 9.

FIG. 11 illustrates example graph 1100 that includes curves depicting voltages (e.g., nodal voltages with respect to ground) that can be measured at various nodes of the circuits of FIGS. 2 and/or 9 during idle mode. The graph 1100 includes curves depicting the OUTP voltage 604, the OUTM voltage 606 of FIG. 6, and the ramp voltage 708 of FIG. 7. The graph 1100 further includes curves depicting an INTP voltage 1102 (e.g., corresponding to the nodal voltage at the $N_{INTP}$ node 250) and an INTM voltage 1104 (e.g., corresponding to the nodal voltage at the $N_{INTM}$ node 252).

The OUTM voltage 606 of FIG. 11 represents the voltage at the $N_{OUTM}$ node 192 during idle mode. As described above, in conjunction with FIG. 9, when the idle mode is detected, the idle mode detector circuit 902 enables the switches 906, 908 to couple the linear regulator 910 to the example $N_{OUTM}$ node 192. In this manner, the OUTM voltage 606 is held at around 0.9*PVDD (e.g., 0.9*14.4 V=12.96 V). Accordingly, the loop filter 200 of FIG. 2 provides the INTP voltage 1102 at around 3.5 V and provides the INTM voltage 1104 at around 1.5 V. Thus, responsive to the modulation circuit 201 comparing the INTP voltage 1102 to the ramp voltage 708, it generates a voltage at the $N_{DP}$ node 256 that is passed to the switch S1 102 (e.g., via the MUX 236) and the switch S2 102 (e.g., via the MUX 236 and the inverter 112), thereby resulting in the 90% duty cycle signal for the OUTP voltage 604. Moreover, the OUTP voltage 604 and the OUTM voltage 606 correspond to 90% of the PVDD, thereby resulting in a zero voltage drop across the speaker 118 without undesired voltage pulses at the $N_{OUTM}$ node 192.

Figure 12:
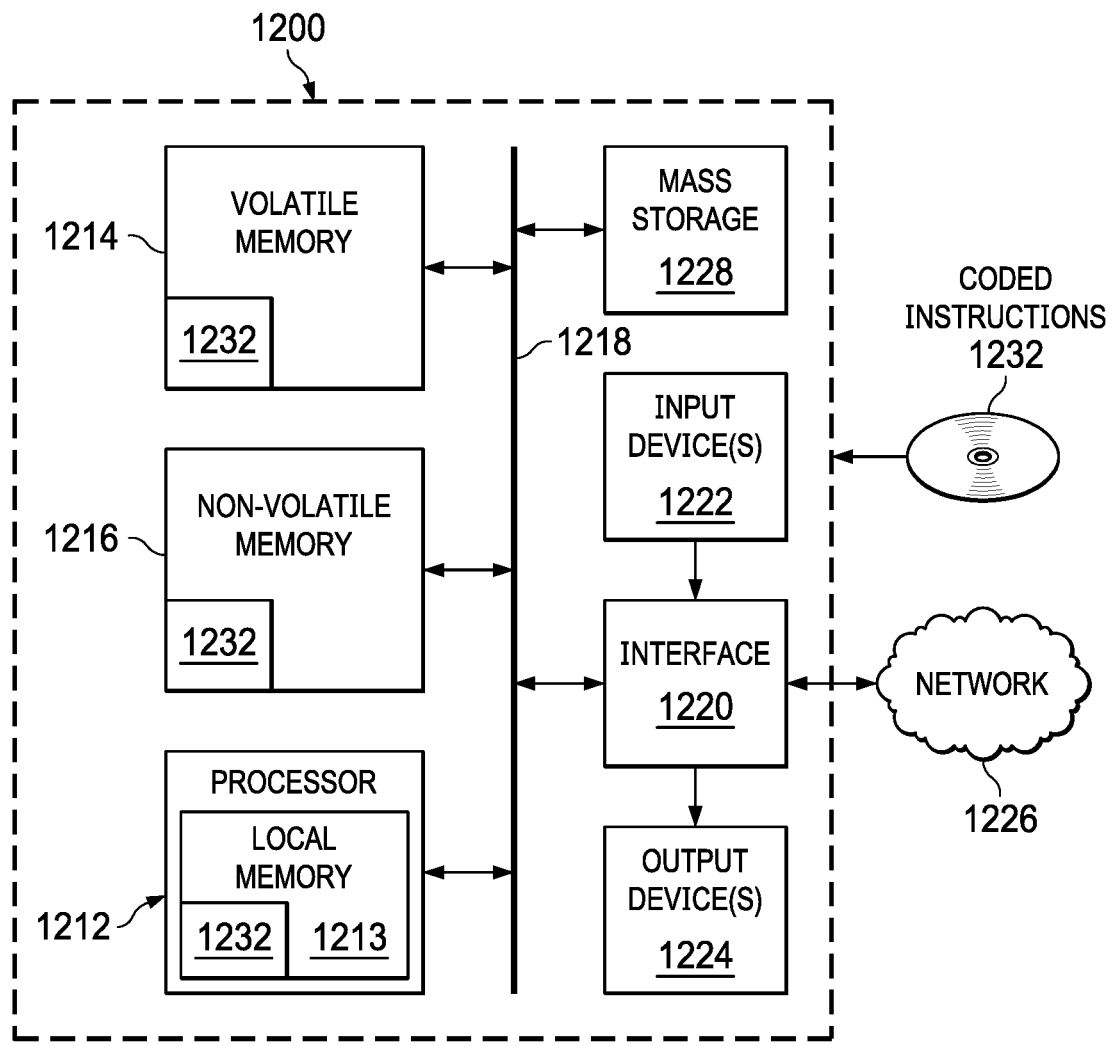
FIG. 12 is a block diagram of an example processing platform structured to execute the instructions of FIGS. 4, 5, and/or 10 to implement the modulator circuit and/or the idle mode detector circuit of FIG. 1-3 and/or 9.

FIG. 12 is a block diagram of an example processor platform 1200 structured to execute the instructions of FIGS. 4, 5, and/or 10 to implement the modulator circuit 124 and/or the idle mode detector circuit 902 of FIGS. 1-3 and/or 9. The processor platform 1200 can be, for example, a server, a personal computer, a workstation, a self-learning machine (e.g., a neural network), a mobile device (e.g., a cell phone, a smart phone, a tablet such as an iPad™), a personal digital assistant (PDA), an Internet appliance, a gaming console, or any other type of computing device.

The processor platform 1200 includes a processor 1212. The processor 1212 of the illustrated example is hardware. For example, the processor 1212 is implemented by one or more integrated circuits, logic circuits, microprocessors, GPUs, DSPs, or controllers from any desired family or manufacturer. The hardware processor may be a semiconductor based (e.g., silicon based) device. The processor 1212 may implement the modulator circuit 124 and/or the idle mode detector circuit 902 of FIGS. 1-3 and/or 9.

The processor 1212 includes a local memory 1213 (e.g., a cache). The processor 1212 of the illustrated example is in communication with a main memory, including a volatile memory 1214 and a non-volatile memory 1216, via a bus 1218. The volatile memory 1214 may be implemented by Synchronous Dynamic Random Access Memory (SDRAM), Dynamic Random Access Memory (DRAM), RAMBUS® Dynamic Random Access Memory (RDRAM®) and/or any other type of random access memory device. The non-volatile memory 1216 may be implemented by flash memory and/or any other desired type of memory device. Access to the main memory 1214, 1216 is controlled by a memory controller.

The processor platform 1200 also includes an interface circuit 1220. The interface circuit 1220 may be implemented by any type of interface standard, such as an Ethernet interface, a universal serial bus (USB), a Bluetooth® interface, a near field communication (NFC) interface, and/or a PCI express interface.

In the illustrated example, one or more input devices 1222 are connected to the interface circuit 1220. The input device(s) 1222 permit(s) a user to enter data and/or commands into the processor 1212. The input device(s) can be implemented by, for example, an audio sensor, a microphone, a camera (still or video), a keyboard, a button, a mouse, a touchscreen, a track-pad, a trackball, isopoint and/or a voice recognition system.

One or more output devices 1224 are also connected to the interface circuit 1220 of the illustrated example. The output devices 1224 can be implemented, for example, by display devices (e.g., a light emitting diode (LED), an organic light emitting diode (OLED), a liquid crystal display (LCD), a cathode ray tube display (CRT), an in-place switching (IPS) display, a touchscreen, etc.), a tactile output device, a printer and/or speaker. The interface circuit 1220 of the illustrated example, thus, may include a graphics driver card, a graphics driver chip and/or a graphics driver processor.

The interface circuit 1220 also includes a communication device such as a transmitter, a receiver, a transceiver, a modem, a residential gateway, a wireless access point, and/or a network interface to facilitate exchange of data with external machines (e.g., computing devices of any kind) via a network 1226. The communication can be via, for example, an Ethernet connection, a digital subscriber line (DSL) connection, a telephone line connection, a coaxial cable system, a satellite system, a line-of-site wireless system, a cellular telephone system, etc.

The processor platform 1200 also includes one or more mass storage devices 1228 for storing software and/or data. Examples of such mass storage devices 1228 include floppy disk drives, hard drive disks, compact disk drives, Blu-ray disk drives, redundant array of independent disks (RAID) systems, and digital versatile disk (DVD) drives.

Machine executable instructions 1232, for instance of FIGS. 4, 5 and/or 10, may be stored in the mass storage device 1228, in the volatile memory 1214, in the non-volatile memory 1216, and/or on a removable non-transitory computer readable storage medium such as a CD or DVD.

An example manner of implementing the modulator circuit 124 of FIG. 1 is illustrated in FIGS. 2 and/or 3 and an example manner of implementing the example idle mode detection circuit 902 of FIG. 9 is illustrated in FIG. 9. However, one or more of the elements, processes and/or devices illustrated in FIGS. 2 and/or 3 may be combined, divided, re-arranged, omitted, eliminated and/or implemented in any other way.

Further, the loop filter 200, the modulation circuit 201, the switching circuit 202, the ramp voltage generator 216, the signal select circuit 240, the counter 302, the comparator 304, the driver(s) 904, and/or more generally, the modulator circuit 124 and/or the idle mode detection circuit 902 of FIGS. 1-3 and/or 9 may be implemented by hardware, software, firmware and/or any combination of hardware, software and/or firmware. Thus, for example, any of the loop filter 200, the modulation circuit 201, the switching circuit 202, the ramp voltage generator 216, the signal select circuit 240, the counter 302, the comparator 304, the driver(s) 904, and/or more generally, the modulator circuit 124 and/or the idle mode detection circuit 902 of FIGS. 1-3 and/or 9 could be implemented by one or more analog or digital circuit(s), logic circuits, programmable processor(s), programmable controller(s), graphics processing unit(s) (GPU(s)), digital signal processor(s) (DSP(s)), application specific integrated circuit(s) (ASIC(s)), programmable logic device(s) (PLD(s)) and/or field programmable logic device(s) (FPLD(s)).

When reading any of the apparatus or system claims of this patent to cover a purely software and/or firmware implementation, at least one of the loop filter 200, the modulation circuit 201, the switching circuit, the ramp voltage generator 216, the signal select circuit 240, the counter 302, the comparator 304, the driver(s) 904, and/or more generally, the modulator circuit 124 and/or the idle mode detection circuit 902 of FIGS. 1-3 and/or 9 is/are hereby expressly defined to include a non-transitory computer readable storage device or storage disk such as a memory, a digital versatile disk (DVD), a compact disk (CD), a Blu-ray disk, etc., including the software and/or firmware. Further still, the modulation circuit 124 and/or the idle mode detector circuit 902 of FIGS. 1-3 and/or 9 may include one or more elements, processes and/or devices in addition to, or instead of, those illustrated in FIGS. 1-3 and/or 9, and/or may include more than one of any or all of the illustrated elements, processes, and devices. As used herein, the phrase "in communication," including variations thereof, encompasses direct communication and/or indirect communication through one or more intermediary components, and does not require direct physical (e.g., wired) communication and/or constant communication, but rather additionally includes selective communication at periodic intervals, scheduled intervals, aperiodic intervals, and/or one-time events.

Flowcharts representative of example hardware logic, machine readable instructions, hardware implemented state machines, and/or any combination thereof for implementing the modulation circuit 124 and/or the idle mode detector circuit 902 of FIGS. 1-3 and/or 9 are shown in FIGS. 4, 5 and/or 10. The machine readable instructions may be one or more executable programs or portion(s) of an executable program for execution by a computer processor such as the processor 1212 shown in the processor platform 1200 discussed above in connection with FIG. 12. The program may be embodied in software stored on a non-transitory computer readable storage medium such as a CD-ROM, a floppy disk, a hard drive, a DVD, a Blu-ray disk, or a memory associated with the processor 1212, but the entire program and/or parts thereof could alternatively be executed by a device other than the processor 1212 and/or embodied in firmware or dedicated hardware.

Further, although the example program is described with reference to the flowchart illustrated in FIG. 12, many other methods of implementing the modulation circuit 124 and/or the idle mode detector circuit 902 of FIGS. 1-3 and/or 9 may alternatively be used. For example, the order of execution of the blocks may be changed, and/or some of the blocks described may be changed, eliminated, or combined. Additionally or alternatively, any or all of the blocks may be implemented by one or more hardware circuits (e.g., discrete and/or integrated analog and/or digital circuitry, an FPGA, an ASIC, a comparator, an operational-amplifier (op-amp), a logic circuit, etc.) structured to perform the corresponding operation without executing software or firmware.

The machine readable instructions described herein may be stored in one or more of a compressed format, an encrypted format, a fragmented format, a compiled format, an executable format, a packaged format, etc. Machine readable instructions as described herein may be stored as data (e.g., portions of instructions, code, representations of code, etc.) that may be utilized to create, manufacture, and/or produce machine executable instructions. For example, the machine readable instructions may be fragmented and stored on one or more storage devices and/or computing devices (e.g., servers). The machine readable instructions may require one or more of installation, modification, adaptation, updating, combining, supplementing, configuring, decryption, decompression, unpacking, distribution, reassignment, compilation, etc. in order to make them directly readable, interpretable, and/or executable by a computing device and/or other machine. For example, the machine readable instructions may be stored in multiple parts, which are individually compressed, encrypted, and stored on separate computing devices, wherein the parts when decrypted, decompressed, and combined form a set of executable instructions that implement a program such as that described herein.

In another example, the machine readable instructions may be stored in a state in which they may be read by a computer, but require addition of a library (e.g., a dynamic link library (DLL)), a software development kit (SDK), an application programming interface (API), etc. in order to execute the instructions on a particular computing device or other device. In another example, the machine readable instructions may need to be configured (e.g., settings stored, data input, network addresses recorded, etc.) before the machine readable instructions and/or the corresponding program(s) can be executed in whole or in part. Thus, the disclosed machine readable instructions and/or corresponding program(s) are intended to encompass such machine readable instructions and/or program(s) regardless of the particular format or state of the machine readable instructions and/or program(s) when stored or otherwise at rest or in transit.

The machine readable instructions described herein can be represented by any past, present, or future instruction language, scripting language, programming language, etc. For example, the machine readable instructions may be represented using any of the following languages: C, C++, Java, C#, Perl, Python, JavaScript, HyperText Markup Language (HTML), Structured Query Language (SQL), Swift, etc.

As mentioned above, the example processes of FIGS. 4, 5 and/or 10 may be implemented using executable instructions (e.g., computer and/or machine readable instructions) stored on a non-transitory computer and/or machine readable medium such as a hard disk drive, a flash memory, a read-only memory, a compact disk, a digital versatile disk, a cache, a random-access memory and/or any other storage device or storage disk in which information is stored for any duration (e.g., for extended time periods, permanently, for brief instances, for temporarily buffering, and/or for caching of the information). As used herein, the term non-transitory computer readable medium is expressly defined to include any type of computer readable storage device and/or storage disk and to exclude propagating signals and to exclude transmission media.

From the foregoing, it will be appreciated that example methods, apparatus and articles of manufacture have been disclosed to generate a modulation protocol to output audio. The disclosed methods, apparatus and articles of manufacture improve the efficiency of using a modulation device by reducing the number of LC circuits needed to filter pulse width modulated signal(s) corresponding to an audio signal, while reducing switching loss, improving THD and still corresponding to good EMI protection.

Although certain example methods, apparatus and articles of manufacture have been disclosed herein, the scope of coverage of this patent is not limited thereto. On the contrary, this patent covers all methods, apparatus and articles of manufacture fairly falling within the scope of the claims of this patent.

Descriptors "first," "second," "third," etc. are used herein when identifying multiple elements or components which may be referred to separately. Unless otherwise specified or understood based on their context of use, such descriptors do not impute any meaning of priority, physical order, or arrangement in a list, or ordering in time but are merely used as labels for referring to multiple elements or components separately for ease of understanding the disclosed examples. In some examples, the descriptor "first" may be used to refer to an element in the detailed description, while the same element may be referred to in a claim with a different descriptor such as "second" or "third." In such instances, it should be understood that such descriptors are used merely for ease of referencing multiple elements or components.

In the description and in the claims, the terms "including" and "having" and variants thereof are intended to be inclusive in a manner similar to the term "comprising" unless otherwise noted. Unless otherwise stated, "about," "approximately," or "substantially" preceding a value means+/−10 percent of the stated value. In another example, "about," "approximately," or "substantially" preceding a value means+/−5 percent of the stated value. IN another example, "about," "approximately," or "substantially" preceding a value means+/−1 percent of the stated value.

The term "couple", "coupled", "couples", and variants thereof, as used herein, may cover connections, communications, or signal paths that enable a functional relationship consistent with this description. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A. Moreover, the terms "couple", "coupled", "couples", or variants thereof, includes an indirect or direct electrical or mechanical connection.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

Although not all separately labeled in the FIGS., components or elements of systems and circuits illustrated therein have one or more conductors or terminus that allow signals into and/or out of the components or elements. The conductors or terminus (or parts thereof) may be referred to herein as pins, pads, terminals (including input terminals, output terminals, reference terminals, and ground terminals, for instance), inputs, outputs, nodes, and interconnects.

As used herein, a "terminal" of a component, device, system, circuit, integrated circuit, or other electronic or semiconductor component, generally refers to a conductor such as a wire, trace, pin, pad, or other connector or interconnect that enables the component, device, system, etc., to electrically and/or mechanically connect to another component, device, system, etc. A terminal may be used, for instance, to receive or provide analog or digital electrical signals (or simply signals) or to electrically connect to a common or ground reference. Accordingly, an input terminal or input is used to receive a signal from another component, device, system, etc. An output terminal or output is used to provide a signal to another component, device, system, etc. Other terminals may be used to connect to a common, ground, or voltage reference, e.g., a reference terminal or ground terminal. A terminal of an IC or a PCB may also be referred to as a pin (a longitudinal conductor) or a pad (a planar conductor). A node refers to a point of connection or interconnection of two or more terminals. An example number of terminals and nodes may be shown. However, depending on a particular circuit or system topology, there may be more or fewer terminals and nodes. However, in some instances, "terminal", "node", "interconnect", "pad", and "pin" may be used interchangeably.

Modifications are possible in the described embodiments, and other embodiments are possible, within the scope of the claims.

What is claimed is:

1. An apparatus comprising:
   a control circuit having first and second control inputs, first and second feedback inputs, and first and second control outputs, the control circuit including:
      a control signal generation circuit having first and second inputs, a first output, an inverted first output, a second output, and an inverted second output, the first input coupled to the first control input, the second input coupled to the second control input;
      a first multiplexer having first and second multiplexer inputs, a first multiplexer control input, and a first multiplexor output, the first multiplexer input coupled to the first output, the second multiplexer input coupled to the inverted second output, the first multiplexer control input coupled to the first and second feedback inputs, and the first multiplexer output coupled to the first control output; and
      a second multiplexer having third and fourth multiplexer inputs, a second multiplexer control input, and a second multiplexor output, the third multiplexer input coupled to the second output, the fourth multiplexer input coupled to the inverted first output, the second multiplexer control input coupled to the first and second feedback inputs, and the second multiplexer output coupled to the second control output;
   a first power stage having a first power stage input and a first power stage output, the first power stage input coupled to the first control output, and the first power stage output coupled to the first feedback input; and
   a second power stage having a second power stage input and a second power stage output, the second power stage input coupled to the second control output, and the second power stage output coupled to the second feedback input.

2. The apparatus of claim 1, wherein the control signal generation circuit includes a modulation circuit.

3. The apparatus of claim 2, wherein the control signal generation circuit is configured to:
   receive a first input signal at the first control input;
   receive a second input signal at the second control input;
   receive a first feedback signal at the first feedback input;
   receive a second feedback signal at the second feedback input;
   generate, using the control signal generation circuit, a first control signal and an inverted version of the first control signal responsive to the first input signal and the second input signal;
   generate, using the control signal generation circuit, a second control signal and an inverted version of the second control signal responsive to the second input signal and the second input signal;
   responsive to at least one of the first or second feedback signals:
      provide, using the first multiplexer, one of the first control signal or the inverted version of the second control signal at the first control output; and
      provide, using the second multiplexer, one of the second control signal or the inverted version of the first control signal at the second control output.

4. The apparatus of claim 3, wherein the control circuit includes an amplifier having amplifier inputs coupled to the first and second control inputs and configured to generate first and second intermediate signals responsive to the first and second input signals, and wherein the modulation circuit is configured to:
   generate the first control signal as a first modulation signal based on a first comparison between the first intermediate signal and a ramp signal; and
   generate the second control signal as a second modulation signal based on a second comparison between the second intermediate signal and the ramp signal.

5. The apparatus of claim 3, wherein the control circuit is configured to:
   detect a first zero crossing from the first feedback signal;
   detect a second zero crossing from the second feedback signal;
   responsive to detecting the first zero crossing, provide, using the first and second multiplexers, the first control signal at the first control output and the second control signal at the second control output; and
   responsive to detecting the second zero crossing, provide, using the first and second multiplexers, the inverted version of the second control signal at the first control output and the inverted version of the first control signal at the second control output.

6. The apparatus of claim 5, wherein the second zero crossing is one of second zero crossings, and wherein the control circuit is configured to, responsive to detecting a threshold number of the second zero crossings, provide the inverted version of the second control signal at the first control output, and provide the inverted version of the first control signal at the second control output.

7. The apparatus of claim 1, further comprising an inductor coupled between the first power stage output and filtered output, and a capacitor coupled between the filtered output and the second power stage output.

8. The apparatus of claim 1, wherein the first control input is coupled to a first audio input, and the second control input is coupled to a second audio input.

9. The apparatus of claim 1, wherein the first power stage output is coupled to a first speaker terminal, and the second power stage output is coupled to a second speaker terminal.

10. The apparatus of claim 6, wherein the control circuit is configured to, responsive to detecting the threshold number of the second zero crossings after detecting the first zero crossing, provide the inverted version of the second control signal at the first control output, and provide the inverted version of the first control signal at the second control output.

11. An apparatus comprising:
a first power stage having a first power stage input and a first power stage output;
a second power stage having a second power stage input and a second power stage output;
a control circuit including a modulator circuit, the control circuit having a first control input, a second control input, a first feedback input, a second feedback input, a first control output, and a second control output, the first feedback input coupled to the first power stage output, the second feedback input coupled to the second power stage output, the first control output coupled to the first power stage input;
a switch coupled between the second control output and the second power stage input, the switch having a switch control terminal; and
a mode detector having a first detector output and a second detector output, the first detector output coupled to the switch control terminal, and the second detector output coupled to the second power stage output.

12. The apparatus of claim 11, wherein the control circuit is configured to:
receive a first input signal at the first control input;
receive a second input signal at the second control input;
receive a first feedback signal at the first feedback input;
receive a second feedback signal at the second feedback input;
generate a first control signal and an inverted version of the first control signal responsive to the first input signal and the second input signal;
generate a second control signal and an inverted version of the second control signal responsive to the first input signal and the second input signal;
responsive to at least one of the first or second feedback signals:
provide one of the first control signal or the inverted version of the second control signal at the first control output; and
provide one of the second control signal or the inverted version of the first control signal at the second control output.

13. The apparatus of claim 12, wherein the control circuit is configured to:
detect a first zero crossing from the first feedback signal;
detect a second zero crossing from the second feedback signal;
responsive to detecting the first zero crossing, provide the first control signal at the first control output, and provide the second control signal at the second control output; and
responsive to detecting the second zero crossing, provide the inverted version of the second control signal at the first control output, and provide the inverted version of the first control signal at the second control output.

14. The apparatus of claim 13, wherein the second zero crossing is one of second zero crossings, and the control circuit is configured to, responsive to detecting a threshold number of the second zero crossings, provide the inverted version of the second control signal at the first control output and the inverted version of the first control signal at the second control output.

15. The apparatus of claim 11, wherein the mode detector is configured to, responsive to detecting an idle mode, disable the switch and set the second power stage output to a particular voltage.

16. The apparatus of claim 15, wherein the mode detector has a detector input coupled to the second power stage, and the mode detector configured to detect the idle mode based on a pulse width of a signal at the second power stage output exceeding a threshold.

17. The apparatus of claim 12, wherein the control circuit includes an amplifier having amplifier inputs coupled to the first and second control inputs and configured to generate first and second intermediate signals responsive to the first and second input signals, and wherein the modulator circuit is configured to:
generate the first control signal as a first modulation signal based on a first comparison between the first intermediate signal and a ramp signal; and
generate the second control signal as a second modulation signal based on a second comparison between the second intermediate signal and the ramp signal.

18. The apparatus of claim 14, wherein the control circuit is configured to, responsive to detecting the threshold number of the second zero crossings after detecting the first zero crossing, provide the inverted version of the second control signal at the first control output and the inverted version of the first control signal at the second control output.

19. A method comprising:
receiving a first input signal;
receiving a second input signal;
receiving a first feedback signal from a first output of a first power stage, the first power stage having a first power stage input;
receiving a second feedback signal from a second output of a second power stage, the second power stage having a second power stage input;
generating a first control signal and an inverted version of the first control signal responsive to the first input signal and the second input signal;
generating a second control signal and an inverted version of the second control signal responsive to the first input signal and the second input signal;
responsive to at least one of the first feedback signal or the second feedback signal:
selecting one of the first control signal or the inverted version of the second control signal; and selecting one of the second control signal or the inverted version of the first control signal;

providing the selected one of the first control signal or the inverted version of the second control signal at the first power stage input; and providing the selected one of the second control signal or the inverted version of the first control signal at the second power stage input.

20. The method of claim 19, wherein responsive to at least one of the first feedback signal or the second feedback signal: selecting one of the first control signal or the inverted version of the second control signal; and selecting one of the second control signal or the inverted version of the first control signal includes:

detecting a first zero crossing from the first feedback signal;

detecting a second zero crossing from the second feedback signal;

responsive to detecting the first zero crossing, selecting the first control signal at the first power stage input, and selecting the second control signal; and responsive to detecting the second zero crossing, selecting the inverted version of the second control signal, and selecting the inverted version of the first control signal.

21. The method of claim 20, wherein the second zero crossing is one of second zero crossings, and wherein responsive to detecting the second zero crossing, selecting the inverted version of the second control signal and selecting the inverted version of the first control signal at the second power stage input includes: responsive to detecting a threshold number of the second zero crossings, selecting the inverted version of the second control signal, and selecting the inverted version of the first control signal.

22. The method of claim 20, wherein detecting a first zero crossing from the first feedback signal includes detecting a first pulse in the first feedback signal; and wherein detecting a second zero crossing from the second feedback signal includes detecting a second pulse in the second feedback signal.

23. The method of claim 22, wherein the second pulse is one of second pulses, and detecting the second pulse in the second feedback signal includes counting a number of the second pulses in the second feedback signal, and detecting the second pulse responsive to counting a threshold number of the second pulses.

24. The method of claim 19, further comprising: responsive detecting an idle mode of operation, disabling the second power stage and applying a voltage to the second output.

25. The method of claim 19, wherein generating the first control signal and the inverted version of the first control signal responsive to the first input signal and the second input signal includes:

generating a first intermediate signal based on the first and second input signals;

generating the first control signal as a first modulation signal based on a first comparison between the first intermediate signal and a ramp signal; and generating the inverted version of the first control signal based on inverting the first modulation signal; and wherein generating the second control signal and the inverted version of the second control signal responsive to the first input signal and the second input signal includes:

generating a second intermediate signal based on the first and second input signals;

generating the second control signal as a second modulation signal based on a second comparison between the second intermediate signal and the ramp signal; and generating the inverted version of the second control signal based on inverting the second modulation signal.

26. The method of claim 21, wherein responsive to detecting a threshold number of the second zero crossings, selecting the inverted version of the second control signal, and selecting the inverted version of the first control signal includes: responsive to detecting the threshold number of the second zero crossings after detecting the first zero crossing, selecting the inverted version of the second control signal, and selecting the inverted version of the first control signal.

* * * * *